(12) United States Patent
Rieutort-Louis et al.

(10) Patent No.: US 11,778,874 B2
(45) Date of Patent: Oct. 3, 2023

(54) REDUCING BORDER WIDTH AROUND A HOLE IN DISPLAY ACTIVE AREA

(71) Applicant: Apple Inc., Cupertino, CA (US)

(72) Inventors: Warren S. Rieutort-Louis, Cupertino, CA (US); Abbas Jamshidi Roudbari, Saratoga, CA (US); Yuchi Che, Santa Clara, CA (US); Tsung-Ting Tsai, San Jose, CA (US); Jiun-Jye Chang, Cupertino, CA (US); Shih Chang Chang, Cupertino, CA (US); Ting-Kuo Chang, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 17/145,815

(22) Filed: Jan. 11, 2021

(65) Prior Publication Data
US 2021/0305350 A1   Sep. 30, 2021

Related U.S. Application Data

(60) Provisional application No. 63/001,949, filed on Mar. 30, 2020.

(51) Int. Cl.
| | |
|---|---|
| *H10K 59/131* | (2023.01) |
| *G09G 3/3225* | (2016.01) |
| *G06F 3/041* | (2006.01) |
| *H10K 77/10* | (2023.01) |

(52) U.S. Cl.
CPC ......... *H10K 59/131* (2023.02); *G06F 3/0412* (2013.01); *G09G 3/3225* (2013.01); *H10K 77/10* (2023.02)

(58) Field of Classification Search
None
See application file for complete search history.

(56) References Cited

U.S. PATENT DOCUMENTS

| | | | |
|---|---|---|---|
| 7,782,694 | B2 | 8/2010 | Kodaira et al. |
| 8,169,556 | B2 | 5/2012 | Oh et al. |
| 8,847,867 | B2 | 9/2014 | Zhang |
| 9,853,096 | B1 | 12/2017 | Choi et al. |

(Continued)

FOREIGN PATENT DOCUMENTS

| | | |
|---|---|---|
| CN | 107863374 A | 3/2018 |
| CN | 108831365 A | 11/2018 |

(Continued)

*Primary Examiner* — Christopher R Lamb
(74) *Attorney, Agent, or Firm* — Treyz Law Group, P.C.; Jason Tsai; Tianyi He

(57) ABSTRACT

An electronic device may include a display having display pixels formed in an active area of the display. The display further includes display driver circuitry for driving gate lines that are routed across the display. A hole such as a through hole, optical window, or other inactive region may be formed within the active area of the display. Multiple gate lines carrying the same signal may be merged together prior to being routed around the hole to help minimize the routing line congestion around the border of the hole. Dummy circuits may be coupled to the merged segment portion to help increase the parasitic loading on the merged segments. The hole may have a tapered shape to help maximize the size of the active area. The hole may have an asymmetric shape to accommodate multiple sub-display sensor components.

29 Claims, 21 Drawing Sheets

(56) References Cited

U.S. PATENT DOCUMENTS

| | | |
|---|---|---|
| 9,989,797 B2 | 6/2018 | Kim et al. |
| 10,038,154 B2 | 7/2018 | Lee et al. |
| 10,444,877 B2 | 10/2019 | Jung et al. |
| 10,607,549 B2 | 3/2020 | Aflatooni et al. |
| 10,620,490 B2 | 4/2020 | Drzaic et al. |
| 2005/0100057 A1 | 5/2005 | Shin |
| 2005/0110727 A1 | 5/2005 | Shin |
| 2005/0119867 A1 | 6/2005 | Shin |
| 2005/0168491 A1 | 8/2005 | Takahara et al. |
| 2008/0024408 A1 | 1/2008 | Sano et al. |
| 2009/0243978 A1 | 10/2009 | Yamamoto et al. |
| 2011/0122173 A1 | 5/2011 | Sehata et al. |
| 2011/0248906 A1 | 10/2011 | Asano |
| 2013/0147690 A1 | 6/2013 | Kim et al. |
| 2013/0235279 A1 | 9/2013 | Sugisaka |
| 2014/0210875 A1 | 7/2014 | Sumi et al. |
| 2014/0307004 A1 | 10/2014 | Roh |
| 2015/0055036 A1 | 2/2015 | Weber et al. |
| 2017/0025487 A1 | 1/2017 | Byun et al. |
| 2017/0076665 A1 | 3/2017 | Kim |
| 2017/0110041 A1* | 4/2017 | Watsuda ............... G09G 3/20 |
| 2017/0125506 A1 | 5/2017 | Kim |
| 2017/0154566 A1* | 6/2017 | Ryoo ............... H01L 27/3276 |
| 2017/0294502 A1 | 10/2017 | Ka et al. |
| 2017/0372661 A1 | 12/2017 | Gu et al. |
| 2018/0123060 A1 | 5/2018 | Jang et al. |
| 2018/0129111 A1* | 5/2018 | Wu ...................... G09G 3/3648 |
| 2018/0182324 A1 | 6/2018 | Lin |
| 2018/0204889 A1* | 7/2018 | Yu ........................ H01L 27/323 |
| 2019/0043418 A1 | 2/2019 | Rieutort-Louis et al. |
| 2019/0043452 A1 | 2/2019 | Silvanto et al. |
| 2019/0073962 A1 | 3/2019 | Aflatooni et al. |
| 2019/0088207 A1 | 3/2019 | Lin et al. |
| 2019/0088208 A1 | 3/2019 | Chang et al. |
| 2019/0109184 A1* | 4/2019 | Li ...................... H01L 27/3248 |
| 2019/0121211 A1 | 4/2019 | Luo et al. |
| 2019/0156725 A1 | 5/2019 | Hsu et al. |
| 2019/0197949 A1* | 6/2019 | Kim ..................... G09G 3/3233 |
| 2019/0228726 A1 | 7/2019 | Ono et al. |
| 2019/0261512 A1* | 8/2019 | Huang ............... H10K 59/1315 |
| 2020/0013842 A1* | 1/2020 | Lee ..................... H01L 51/5253 |
| 2020/0064702 A1* | 2/2020 | Yeh .................... H01L 27/3246 |
| 2020/0105853 A1 | 4/2020 | Kwon |
| 2020/0110525 A1 | 4/2020 | Park et al. |
| 2020/0176526 A1* | 6/2020 | Yoon ................. H10K 59/1213 |

FOREIGN PATENT DOCUMENTS

| | | |
|---|---|---|
| CN | 109493725 A | 3/2019 |
| EP | 2189969 A2 | 5/2010 |
| WO | 2019047126 A1 | 3/2019 |
| WO | 2019199139 A1 | 10/2019 |

* cited by examiner

REDUCING BORDER WIDTH AROUND A HOLE IN DISPLAY ACTIVE AREA

This application claims the benefit of provisional patent application No. 63/001,949, filed Mar. 30, 2020, which is hereby incorporated by reference herein in its entirety.

BACKGROUND

This relates generally to electronic devices and, more particularly, to electronic devices with displays.

Electronic devices often include displays. Displays are typically driven using a display driver circuit and a gate driver circuit. The display driver circuit provides data signals to corresponding display pixels via data lines, whereas the gate driver circuit provides control signals via gate lines to selectively load the data signals into a subset of the display pixels. The display pixels are formed in a region sometimes referred to as an active area. The design of a display with a rectangular uninterrupted active area is generally straightforward since the data lines and gate lines can be routed in a regular grid-like pattern across the display.

Some displays, however, deviate from the convention active area and may have one or more holes or inactive regions within the active area. It may be challenging to route the data lines and gate lines in such types of displays having holes in the active area. If care is not taken, the display border near the holes may be overly congested and can result in increased border width.

SUMMARY

An electronic device may include a display having an array of display pixels formed in an active area of the display. One or more inactive regions may be formed in the active area. The inactive region may be a through hole, optical window that is not a through hole, or other types of opening within the display that is devoid of pixels. The display may further include a display driver circuit configured to output a control signal onto a first row control line coupled to a first row of the display pixels and to output the control signal onto a second row control line coupled to a second row of the display pixels, where the first and second row control lines are merged into a segment (i.e., a merged segment) that is routed by the inactive region. The control signal may be a scan line signal, an emission line signal, an initialization line signal, a reset signal, an enable signal, a data line signal, a reference signal, or other suitable data/control signals that are simultaneously supplied to two or more pixel rows in the active area.

If desired, a dummy circuit such as a capacitor circuit may be coupled o the merged segment and may be configured to increase the parasitic on the first and second row control lines. The merged segment may be coupled between a first merging node and a second fanout/splitting node. The first node may be connected to the first and second row control lines. The merged segment may be configured to split into at least first and second additional row control lines at the second fanout node.

The display driver circuit may be formed on one side of the display. The display may further include an additional display driver circuit configured to output an additional control signal onto a third row control line coupled to the first row of display pixels and to output the additional control signal onto a fourth control line coupled to the second row of display pixels. The third and fourth row control lines may be merged into an additional segment that is routed by the inactive region. If desired, three or more parallel row control lines can be connected to the merged segment.

In one suitable arrangement, the inactive region may have a substantially rounded or circular shape. In another suitable arrangement, the inactive region may have a substantially rectangular shape. In yet another suitable arrangement, the inactive region may have a symmetrically or asymmetrically tapered shape optimized to increase the size of the active area. The row lines extending horizontally across the face of the display and the column lines extending vertically across the face of the display may both extend into a hole border region surrounding the inactive region. The hole border region may define the hole border width and may be non-overlapping with the active area. In another suitable arrangement, only the row lines may extend into the hole border region while the column lines do not extend into the hole border region but remain within the active area when routing around the inactive region. In yet another suitable arrangement, only the column lines may extend into the hole border region while the row lines do not extend into the hole border region but remain within the active area when routing around the inactive region. The row/column lines that remain within the active area may overlap with one or more display pixels and may be formed using an upper metal layer such as an anode layer, a source-drain metal routing layer, or one of the touch sensor layers or using a buried metal layer that is formed over a substrate layer and under a low temperature polysilicon layer.

DETAILED DESCRIPTION

Figure 1:
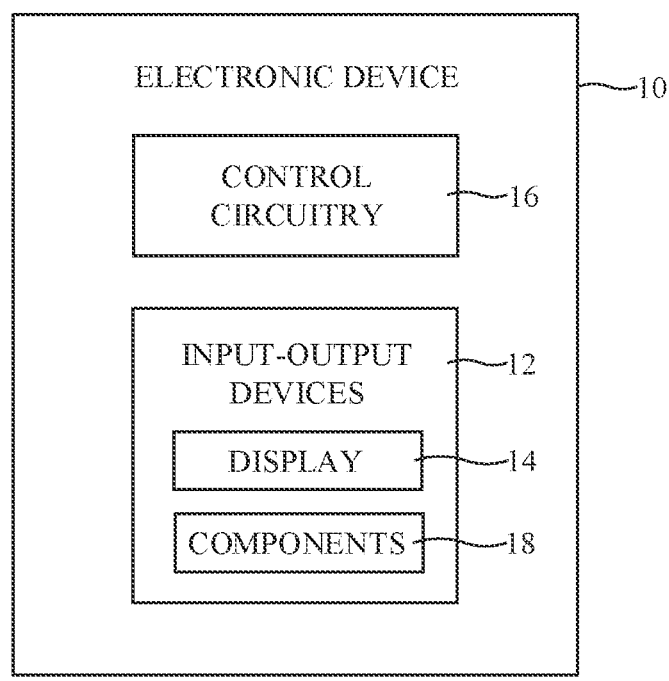
FIG. 1 is a diagram of an illustrative electronic device having a display in accordance with an embodiment.

An illustrative electronic device of the type that may be provided with a display is shown in FIG. 1. Electronic device 10 of FIG. 1 may be a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment such as head-mounted devices, or other suitable electronic device.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 via the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Display 14 may have a substantially rectangular shape (i.e., display 14 may have a rectangular footprint and a rectangular peripheral edge that runs around the rectangular footprint) or may have other suitable shapes. Display 14 may be planar or may have a curved profile. Display 14 may be an organic light-emitting diode display, a liquid crystal display, a liquid-crystal-on-silicon display, a microelectromechanical systems (MEMs) display, or other suitable type of display.

It may be desirable to incorporate electrical components into device 10 and/or into or under display 14. For example, components 18 may be audio components (e.g., microphones, speakers, etc.), radio-frequency components, haptic components (e.g., piezoelectric structures, vibrators, etc.), may be capacitive touch sensor components or other touch sensor structures, may be temperature sensors, pressure/force sensors, magnetic sensors, fingerprint sensors, or other sensors, or may be any other suitable type of electrical component. With one suitable arrangement, which may sometimes be described herein as an example, electrical components 18 may be light-based sensor components (e.g., ambient light sensors, proximity sensors, or components that emit and/or detect visible light, infrared light, and/or ultra-violet light).

Examples of light-based components 18 that emit light include light-emitting diodes (e.g., organic light-emitting diodes, discrete crystalline light-emitting diode dies, etc.), lasers, and lamps. Examples of light-based components that detect light include light detectors such as photodiodes and phototransistors. Some components may, if desired, include both light emitters and detectors. For example, components 18 may emit infrared light and may include light detector structures for detecting a portion of the emitted light that has reflected from nearby objects. Components of this type may be used to implement a proximity sensor.

Figure 2:
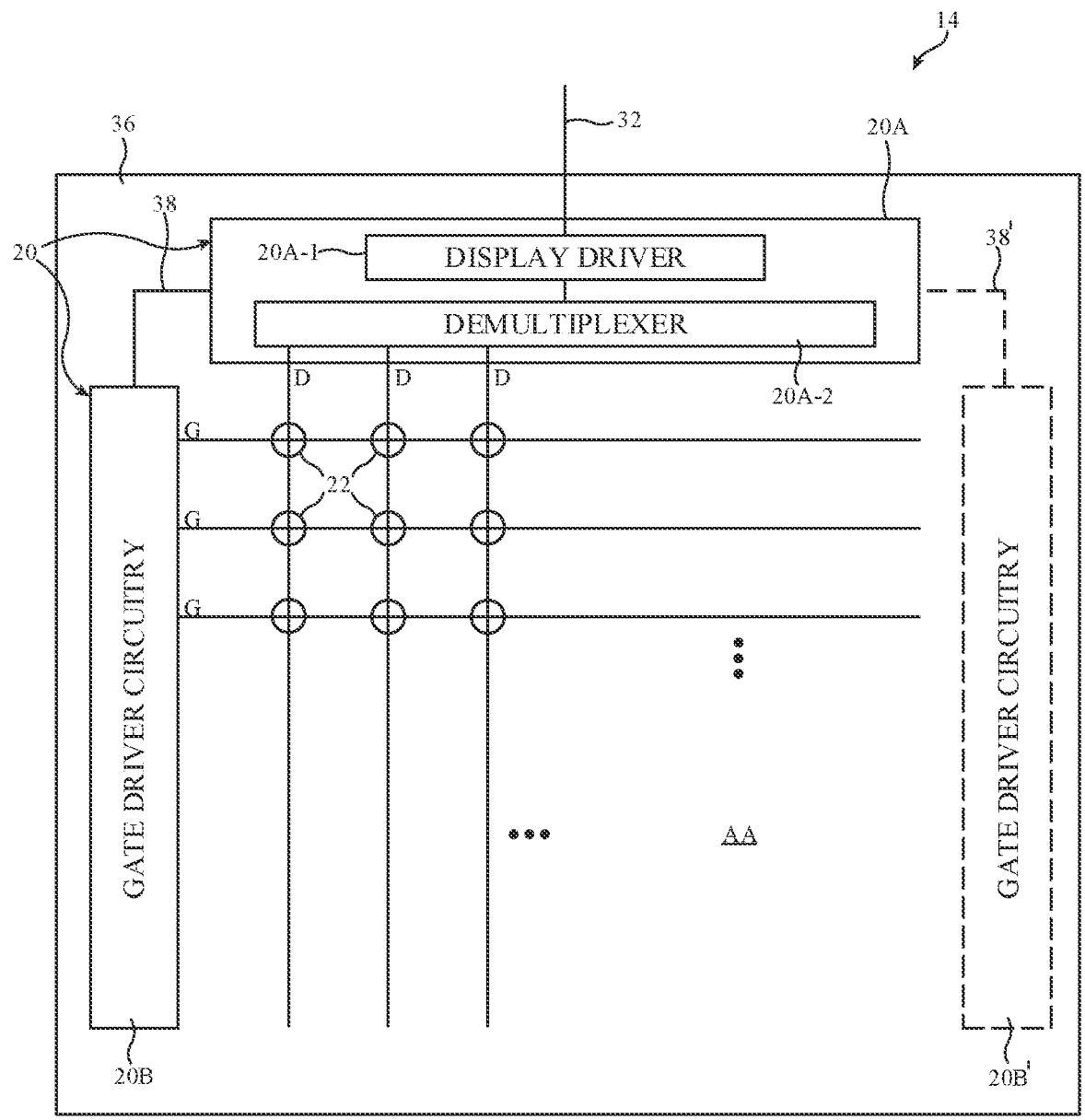
FIG. 2 is a top plan view of an illustrative display in an electronic device in accordance with an embodiment.

FIG. 2 is a top plan (layout) view of an illustrative display 14 in electronic device 10. As shown in FIG. 2, display 14 may have an array of pixels 22 formed from substrate structures such as substrate 36. The region on substrate 36 in which the array of pixels 22 are formed is sometimes referred to as the "active area" (AA). Region(s) outside the area active may be referred to as the inactive area or inactive region. Substrates such as substrate 36 may be formed from glass, metal, plastic, ceramic, or other substrate materials. Pixels 22 may receive data signals over signal paths such as data lines D and may receive one or more control signals over control signal paths such as gate lines G (sometimes referred to as control lines, scan lines, emission enable lines, gate signal paths, etc.). There may be any suitable number of rows and columns of pixels 22 in display 14 (e.g., tens or more, hundreds or more, or thousands or more). Pixels 22 may have different colors (e.g., red, green, and blue) to provide display 14 with the ability to display color images. The pixel circuits in pixels 22 may contain transistors (e.g., thin-film transistors on substrate 36) having gates that are controlled by gate line signals on gate lines G. The terms "rows" and "columns" may be used to refer to any array of display pixels and may sometimes be used interchangeably (e.g., gate lines may also be referred to as column lines, whereas data lines may be referred to as row lines).

Display driver circuitry 20 may be used to control the operation of pixels 22. Display driver circuitry 20 may be formed from integrated circuits, thin-film transistor circuits, or other suitable circuitry. Thin-film transistor circuitry for display driver circuitry 20 and pixels 22 may be formed from polysilicon thin-film transistors, semiconducting-oxide thin-film transistors such as indium gallium zinc oxide (IGZO) transistors, or thin-film transistors formed from other semiconductor material.

Display driver circuitry 20 may include display driver circuits such as display driver circuitry 20A and gate driver circuitry 20B. Display driver circuitry 20A may include a display driver circuit 20A-1 that is formed from one or more display driver integrated circuits (e.g., timing controller integrated circuits) and/or thin-film transistor circuitry and may include demultiplexer circuitry 20A-2 (e.g., a demultiplexer formed from thin-film transistor circuitry or formed in an integrated circuit). Gate driver circuitry 20B may be formed from thin-film transistor circuitry or may be formed in gate driver integrated circuits.

Display driver circuitry 20A may contain communications circuitry for communicating with system control circuitry such as control circuitry 16 of FIG. 1 over path 32. Path 32 may be formed from traces on a flexible printed circuit or other conductive lines. During normal operation, the control circuitry (e.g., control circuitry 16 of FIG. 1) may supply circuitry 20A with information on images to be displayed on display 14. To display images on display pixels 22, display driver circuitry 20A may supply image data to data lines D while issuing control signals (e.g., clock signals, a gate start pulse, etc.) to support display driver circuitry such as gate driver circuitry 20B over path 38. Display driver circuitry 20A may also dynamically adjust demultiplexer circuitry 20A-2 by supplying clock signals, select signals, and/or other control signals to demultiplexer circuitry 20A-2. If desired, gate driver circuitry may optionally be formed on more than one side of display 14 (see, e.g., gate driver circuitry 20B' formed at the opposing edge of substrate 36). In such arrangements, display driver circuitry 20A may also issue control signals to support gate driver circuitry 20B' over path 38'.

Figure 3:
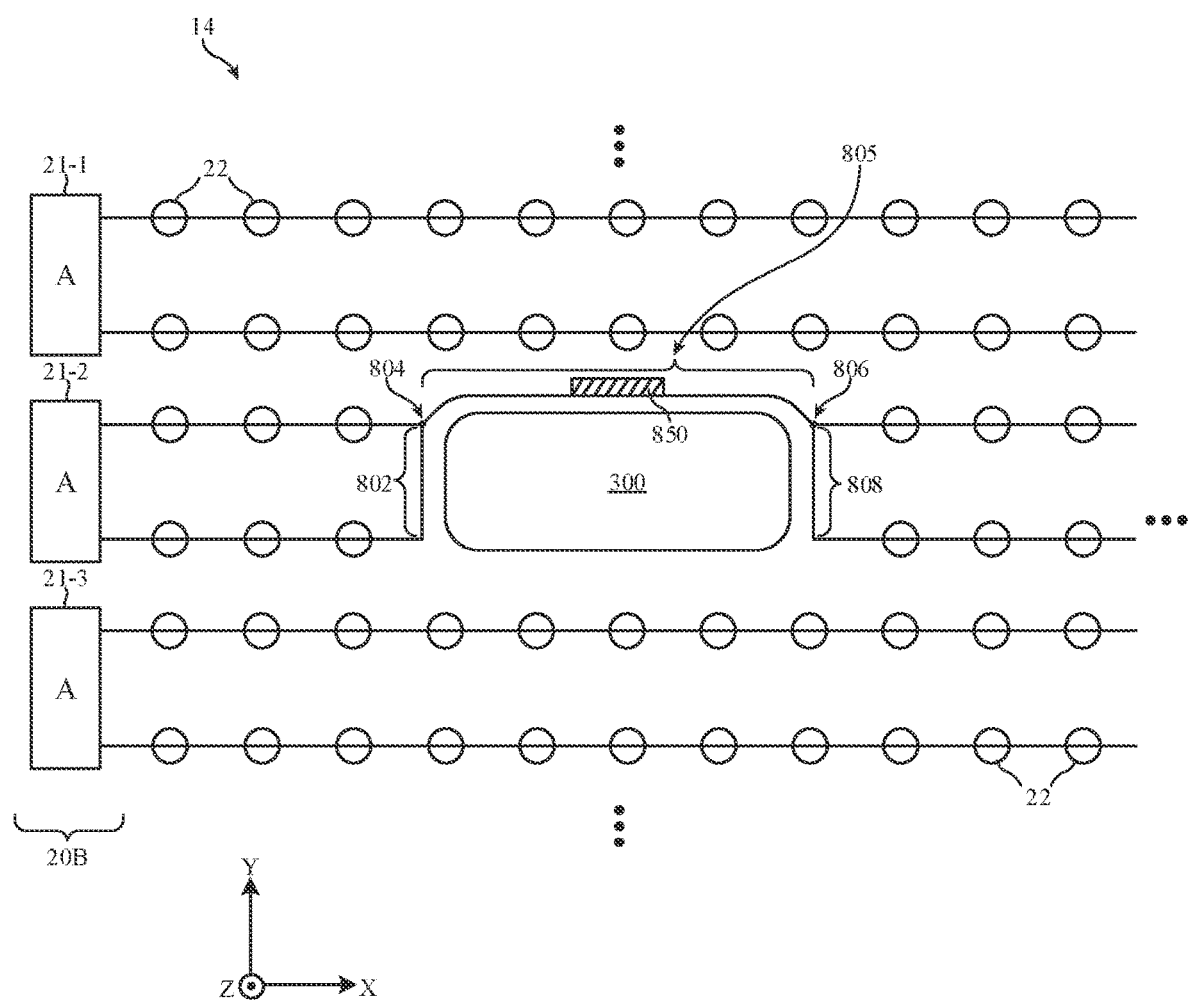
FIG. 3 is a top plan view of display circuitry showing how multi-row single-sided gate driver circuits may be configured to drive corresponding gate lines that are merged prior to being routed around a hole in a display active area in accordance with an embodiment.

FIG. 3 is a top plan view of one implementation of display 14 showing how multi-row single-sided gate drivers may be used to drive corresponding gate lines that are routed around a hole in the active area when viewed from the front of the display surface in direction Z towards the X-Y plane. In one suitable arrangement, display 14 may be substantially coplanar with the X-Y plane (i.e., the display substrate is formed in a single plane). In another suitable arrangement, display 14 may instead be curved and protrude from the X-Y plane. In general, device 10 (and display 14) can exhibit any suitable shape.

In the example of FIG. 3A, gate driver circuitry 20B is only formed on one edge of the display (i.e., there is no gate driver circuitry 20B' formed at the right edge of the display).

Gate driver circuitry 20B may include multiple gate drivers 21 configured to drive corresponding gate lines G. Gate driver 21-1 may be configured to drive a first gate line pair coupled to first and second rows of display pixels 22. Gate driver 21-2 may be configured to drive a second gate line pair coupled to third and fourth rows of display pixels 22. Gate driver 21-3 may be configured to drive a third gate line pair coupled to fifth and sixth rows of display pixels 22. In FIG. 3, each individual gate driver circuit 21 may be configured to generate a corresponding row control signal A, but the waveforms output from each circuit 21 may be offset in time relative to one another. For example, circuit 21-1 may output control signal A(1); circuit 21-2 may output control signal A(2); circuit 21-3 may output control signal A(3); and so on.

In certain embodiments, a hole such as hole 300 may be formed within the display active area. Hole 300 may be at least partially or completely surrounded by the active area. The term "hole" may generically refer to a region within the active area that does not include any display pixels and may be a through hole (e.g., an opening formed from the top surface of the display substrate all the way through the bottom surface of the display substrate), an optical window (e.g., a portion of continuous display substrate through which optical signals can still traverse through the substrate), or other inactive region.

Figure 4A:
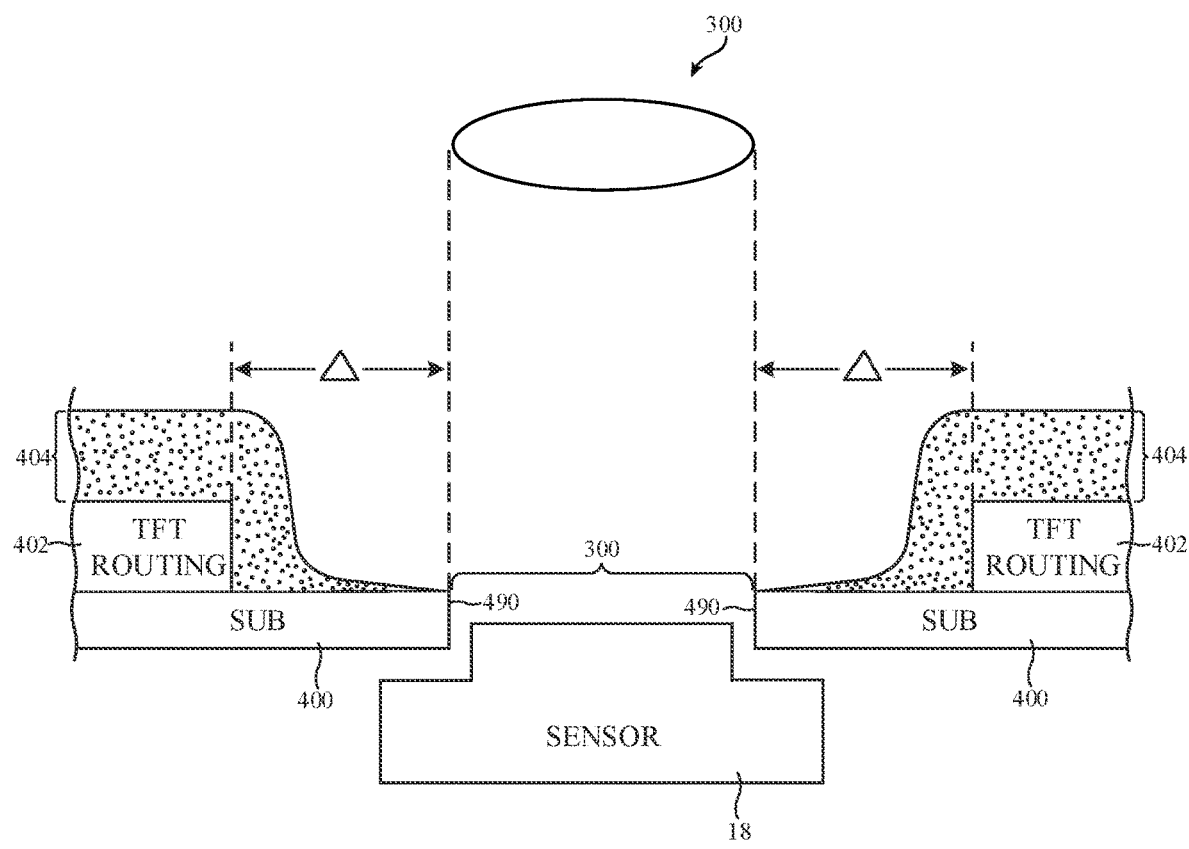
FIG. 4A is a cross-sectional side view of an illustrative through hole that can be formed in the display active area in accordance with an embodiment.

FIG. 4A is a cross-sectional side view of an illustrative through hole that can be formed in the display active area. As shown in FIG. 4A, the display may generally include a substrate layer 400 (which may be equivalent to substrate 36 described in connection with FIG. 2), thin-film transistor (TFT) routing layers 402 formed on substrate 400, and encapsulation layers 404 covering the TFT routing layers 402. Display pixel structures and associated routing lines, display driver circuitry, and/or gate driver circuitry may be formed within the TFT routing layers 402. Encapsulation layer 404 may include some combination of organic and inorganic layers configured to help prevent moisture and/or other contaminants from seeping into the TFT routing layers 402.

In the example of FIG. 4A, hole 300 may be implemented as a through hole that extends completely through the display substrate layer 400 (i.e., the inactive region 300 may be a hole that is drilled or cut through the entire thickness of substrate 400). If desired, one or more component such as light sensor 18 of the type described in connection with FIG. 1 may be located directly under hole 300 such that light or other signals may traverse hole 300 to arrive at sensor 18. Hole 300 may be defined by substrate edge 490. The TFT routing layers 402 have to be formed at a minimum distance A from the substrate edge 490 so that encapsulation layer 404 can be properly formed (e.g., so that encapsulation layer 404 can taper off). This minimum distance A is therefore sometimes referred to as an encapsulation finishing margin. Thus, distance A defines the closest point at which the control line routing segments (which are formed within TFT routing layers 402) may be formed relative to the edge of hole 300.

Figure 4B:
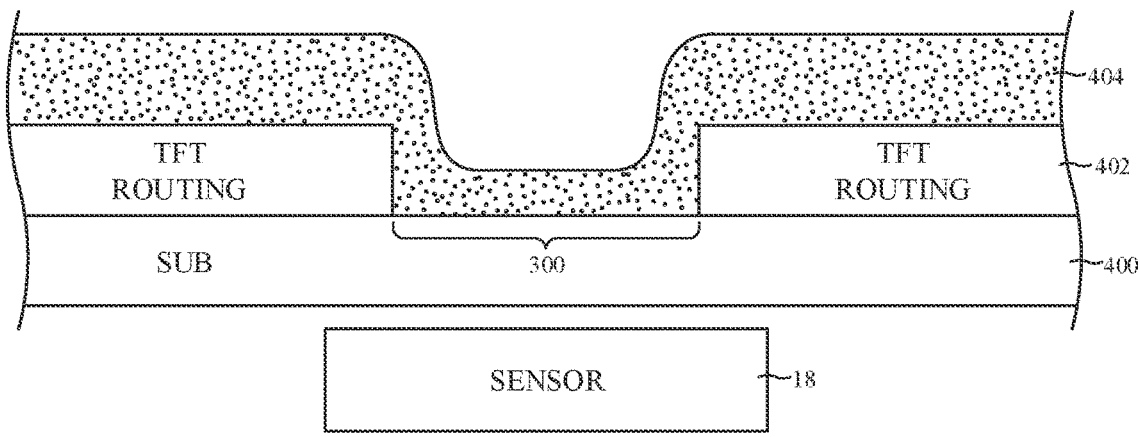
FIG. 4B is a cross-sectional side view of an illustrative optical window that can be formed in the display active area in accordance with an embodiment.

FIG. 4B is a cross-sectional side view of an illustrative optical window that can be formed in the display active area in accordance with another suitable embodiment. As shown in FIG. 4B, the display may generally include substrate layer 400, thin-film transistor (TFT) routing layers 402 formed on substrate 400, and encapsulation layers 404 covering the TFT routing layers 402. Display pixel structures and associated routing lines, display driver circuitry, and/or gate driver circuitry may be formed within the TFT routing layers 402. Encapsulation layer 404 may include some combination of organic and inorganic layers configured to help prevent moisture and/or other contaminants from seeping into the TFT routing layers 402.

In the example of FIG. 4B, hole 300 may be implemented as an optical window that allows light or other signals to pass through substrate 400. Unlike the cut through hole in FIG. 4A, the optical window 300 of FIG. 4B includes a continuous substrate layer 400 overlapping completely with window 300 (when viewing the front face of the display from above). Since there is no interruption of the substrate 400 in inactive hole region 300, encapsulation layer 404 may also be formed over hole region 300. The presence of layers 400 and 404 will not block light or other desired signals from traversing optical window 300.

If desired, one or more component such as light sensor 18 of the type described in connection with FIG. 1 may be located directly under optical window 300 such that light or other signals may traverse window 300 to arrive at sensor 18. Since the substrate is not actually cut open in optical window 300 (i.e., there is no substrate edge within the optical window region), the TFT routing layers 402 are not constrained by any encapsulation finishing margin. As such, the TFT routing layers 402 may be formed all way up to the edge of optical window 300. Comparing FIGS. 4A and 4B, one can see that the TFT routing layers 402 may be formed closer to the edge of hole 300 in the optical window configuration of FIG. 4B. In other words, control line routing segments (which are formed within TFT routing layers 402) may be formed closer to the border of hole 300 when hole 300 is implemented as an optical window, which can help reduce the overall hole border width.

Referring back to FIG. 3, gate lines formed above and below inactive region 300 may be straight and may be coupled to display pixels 22 spaced at regular intervals (see, e.g., gate lines G driven by circuits 21-1 and 21-3). In contrast, gate lines formed in rows overlapping with hole 300 have to be routed around hole 300 (see, e.g., gate lines G driven by circuits 21-2). In conventional displays with multi-row gate driver circuits, the two gate lines in each gate line pair will have to be routed around the border of hole 300, resulting in routing line congestion which would dramatically increase the minimize required border width surrounding hole 300.

In accordance with an embodiment, multi-row driving schemes may have multiple routing lines merged prior to be routed around hole 300. As shown in FIG. 3A, each driver circuit 21 may be a multi-row driver circuit configured to generate control signal A (e.g., a scan line signal, an emission line signal, or other row control signal) that is fed simultaneously to two adjacent pixel rows. In other words, circuit 21 may be configured to output signal A(n) onto rows n and (n+1). For instance, driver circuit 21-2 may be configured to drive control signal A onto a first linear/straight segment coupled to the third row of pixels located in the active area to the left of hole 300 and onto a second linear/straight segment coupled to the fourth row of pixels located in the active area to the left of hole 300. The second linear segment may merge with the first linear segment via a connecting/shorting segment 802 so that the first and second linear (straight) segments join or merge at node 804. From this point on, a single (merged) routing line or merged segment 805 (sometimes referred to as an intermediate routing segment) may be routed around and along the border of hole 300 to reach the active area to the right of hole 300.

The merged routing segment (which may be curved or have any suitable trajectory depending on the shape of hole 300) may extend from node 804 to node 806. At node 806, the merged routing segment 805 may split into a third linear segment and a fourth linear segment using fanout segment 808. The third linear segment may be coupled to the third row of pixels located in the active area to the right of hole 300, whereas the fourth linear segment may be coupled to the fourth row of pixels located in the active area to the right of hole 300.

Although FIG. 3 only shows six pixel rows, the display may generally include any number of gate driver circuits (e.g., hundreds or thousands of individual multi-row gate drivers) formed at the left and/or right edges of the display, each of which is capable of outputting gate line signals or row control signals to two or more rows of display pixels. The example of FIG. 3 in which hole 300 overlaps with approximately two pixel rows and four pixel columns is merely illustrative and is not intended to limit the present embodiments. In general, hole 300 may have X and/or Y dimensions spanning two to ten displays, 10-100 pixels, hundreds or thousands of pixels, etc (e.g., hole 300 have a Y dimension spanning any suitable number of pixel rows and an X dimension spanning any suitable number of pixel columns). Thus, any intermediate merged segments being routed around hole 300 may potentially represent paths with lengths of several microns to several millimeters that are uninterrupted by pixels.

The merged routing segment 805 connected between nodes 804 and 806 may be completely free of pixels 22 (i.e., there are no pixels connected to the intermediate routing segment that is routed around hole 300). Thus, the number of pixels formed along the entirety of such gate lines may be different than that for gate lines in normal pixel rows with pixels formed at regular non-interrupted intervals (see, FIG. 3 where the number of pixels 22 connected to the first gate line feeding the first pixel row is more than the number of pixels connected to the third gate line feeding the third pixel row). To help match the loading for routing lines that are coupled to fewer display pixels with the loading on the normal gate lines, dummy circuit components such as dummy circuits 850 may be coupled to the pixel-free merged routing segments to help mimic the loading of display pixels that would have been formed between the merging and splitting nodes had hole 300 not been in the way. Dummy circuits 850 may be capacitive circuits, dummy transistor structures, dummy pixel structures, passive electrical components, or other suitable loading components that occupy up minimal circuit area to help reduce routing congestion around hole 300. Intentionally providing parasitic loading in this way to balance the load among all the row control/routing lines can help reduce undesired display artifacts.

Figure 5:
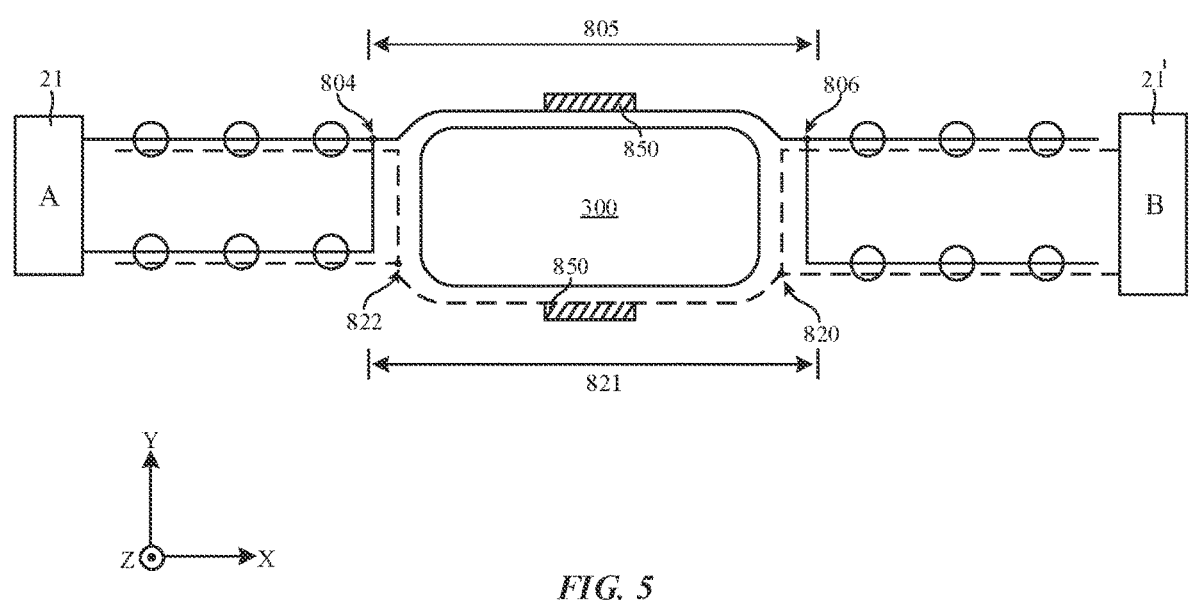
FIG. 5 is a top plan view of showing how merging and splitting of gate lines may occur from both sides of a hole in accordance with an embodiment.

The merging of routing lines at one edge of hole 300 and the splitting/fanout of routing lines at another edge of hole 300 described above for multi-row gate driver circuit 21-2 of FIG. 3 may also be applied to multi-gate driver 21' formed along an opposing edge of display (see, e.g., FIG. 5). As shown in FIG. 5, multi-gate driver 21' may be configured to output control signal B to at least two pixel rows in parallel (e.g., circuit 21' may be configured to output signal B(n) onto rows n and (n+1). Hole 300 may be at least partially physically interposed between circuits 21 and 21'. As shown in FIG. 5, the merging of linear gate line segments stemming from circuit 21' may occur at node 820, whereas the fanout into multiple linear gate line segments after being routed around hole 300 may occur at node 822. The merged routing segment 821 coupled between nodes 820 and 822 may help reduce routing line congestion for gate lines associated with multi-row driver circuit 21'. Since the routing congestion dictates the minimum hole border width, merging or shorting multi-row control lines in this way can dramatically decrease border width around hole 300. If desired, dummy circuit 850 may also be attached to intermediate routing segment 821 to facilitate with load balancing.

The example of FIGS. 3 and 5 in which the merged routing lines are routed around the periphery of hole 300 is merely illustrative. Routing around or circumventing hole 300 may be necessary when hole 300 is implemented as a through hole of the type described in connection with FIG. 4A or as another structure that prevents or prohibits routing lines from being routed through the inactive hole region. In other suitable arrangements, such as when hole 300 is implemented as an optical window of the type shown in FIG. 4B, the merged routing lines may be routed directly over and through hole region 300 as shown in the top plan (layout) view of FIG. 6. In other words, the control lines being routed across hole 300 do not have to be routed along the border of hole 300 and can remain as rectilinear/straight segments. Such routing configuration may be used as long as hole 300 is not implemented as a cut through hole.

Figure 6:
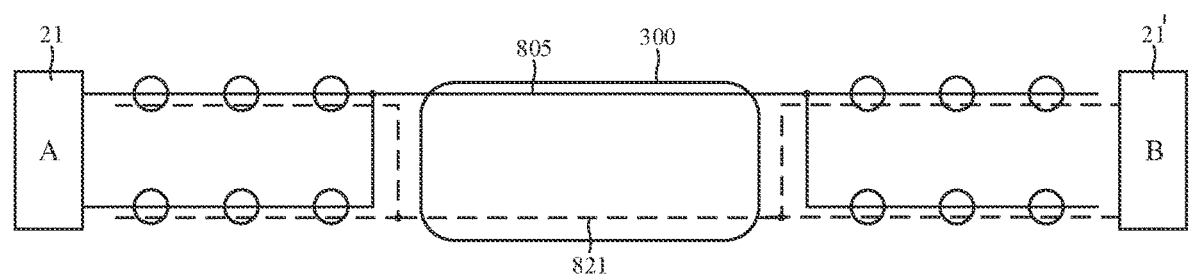
FIG. 6 is a top plan view of illustrative display circuitry showing how multi-row single-sided gate driver circuits may be configured to drive corresponding gate lines that are merged prior to being routed directly over an optical window in accordance with an embodiment.
Figure 7:
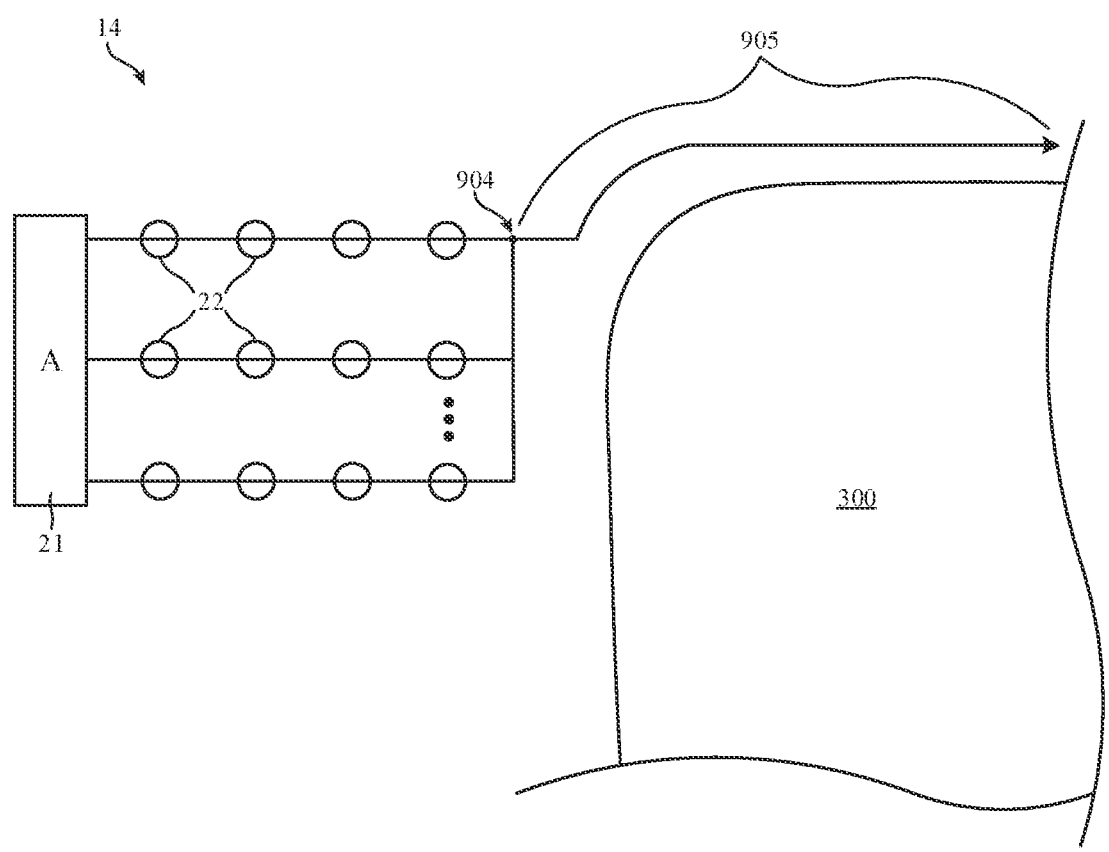
FIG. 7 is a diagram illustrating how three or more control lines can be connected together at the edge of a hole in accordance with an embodiment.

The examples of FIGS. 3, 5, and 6 in which a multi-row gate driver circuit is configured drive a control signal to pixels arranged along two adjacent rows is merely illustrative and is not intended to limit the scope of the present embodiments. In general, a single peripheral driver circuit such as multi-row driver circuit 21 as shown in FIG. 7 may be configured to generate a corresponding control signal A (e.g., a scan signal, an emission signal, an initialization signal, a reference signal, a reset signal, an enable signal, a row control signal, a column control signal, etc.) simultaneously onto more than two control lines (e.g., three or more row control lines in adjacent/consecutive rows, three or more row control lines in non-adjacent/non-consecutive rows, 4-10 row control signals in adjacent or non-adjacent rows, etc.), where the multi-row control lines carrying the same signal waveform output from circuit 21 are merged or connected at shorting node 904 and where the merged single routing segment 905 is routed around or directly though hole 300.

Figure 8A:
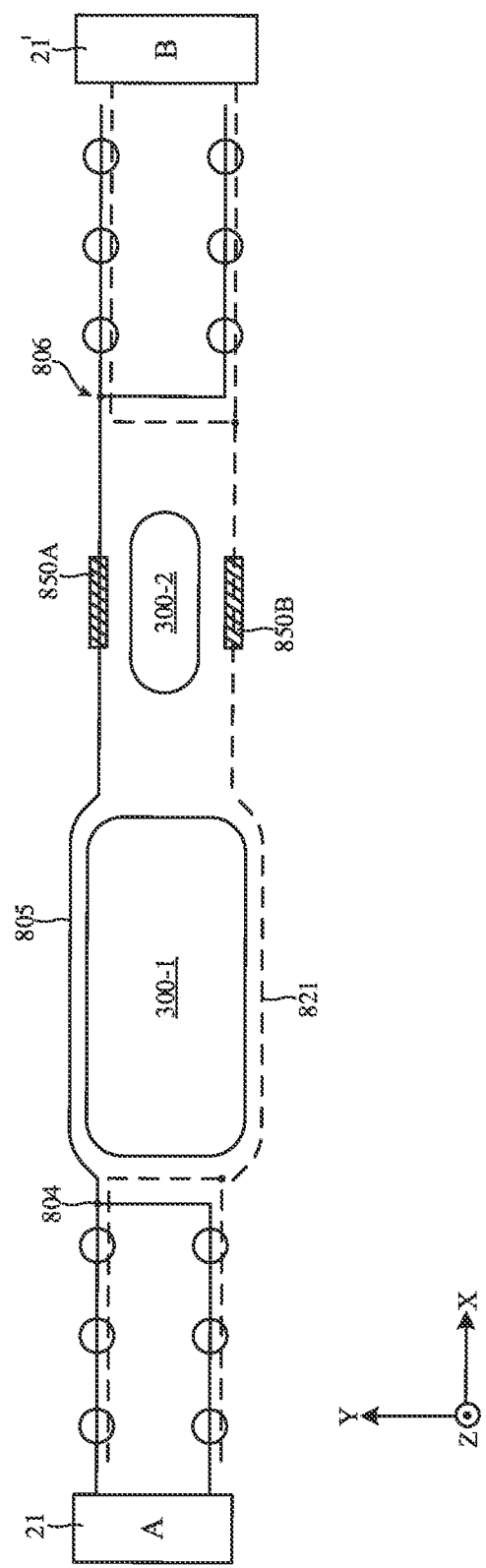
FIG. 8A is a top plan view showing out dummy loading circuits may be attached in the vicinity of a smaller hole in accordance with an embodiment.

The embodiments of FIGS. 3-7 where display 14 includes one hole 300 is merely illustrative and is not intended to limit the scope of the present embodiments. In accordance with some embodiments, the display may include two or more holes formed within the active area (see, e.g., FIG. 8A). As shown in FIG. 8A, display 14 may include at least a first hole 300-1 and a second hole 300-2 formed in the active area. Each of holes 300-1 and 300-2 may correspond to a through hole of the type described in connection with FIG. 4A, an optical window of the type described in connection with FIG. 4B, or other inactive region lacking display pixels. Holes 300-1 and 300-2 need not be the same size and shape. In the example of FIG. 8A, holes 300-1 and 300-2 have different sizes and shapes (e.g., hole 300-1 may be larger than hole 300-2; hole 300-1 may be circular, whereas hole 300-2 may be elliptical).

In such an arrangement the potential routing congestion near the border of the larger hole 300-1 may be more pronounced that the routing congestion near the border of the smaller hole 300-2 since there is necessarily less space occupied by the smaller hole 300-2. As shown in FIG. 8A, the merged routing segment connecting node 804 in the active area to the left of hole 300-1 to node 806 in the active area to the right of hole 300-2 may have more room for routing in the vicinity of the smaller hole 300-2 (e.g., the intermediate routing segment connecting nodes 804 and 806 may have a first meandering portion that needs to be routed around hole 300-1 and a second straight portion that takes on a more direct path to node 806). Since there is more free circuit area around the smaller hole 300-2, the dummy loading circuits may be physically formed in the vicinity of the smaller hole. For example, a first dummy loading component 850A that is coupled to the first merged routing segment 805 carrying control signal A may be formed in the free space above hole 300-2 (when viewed from the front of the display in direction Z towards the X-Y plane), whereas a second dummy loading component 850B that is coupled to the second merged routing segment 821 carrying control signal B may be formed in the free space located below hole 300-2. Thus, in general, it may be desirable to form dummy loading circuits near, around, or at the borders of the smaller inactive regions.

Figure 8B:
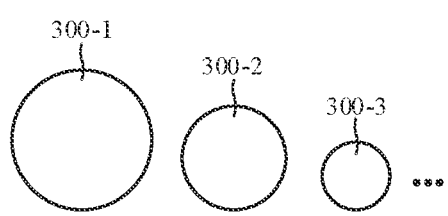
FIGS. 8B-8F are diagrams illustrating holes of different sizes and shapes that can be formed in the display active area in accordance with some embodiments.
Figure 8C:
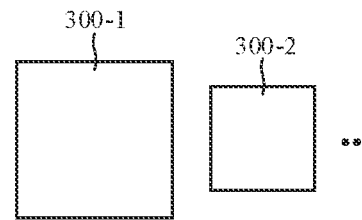
Figure 8D:
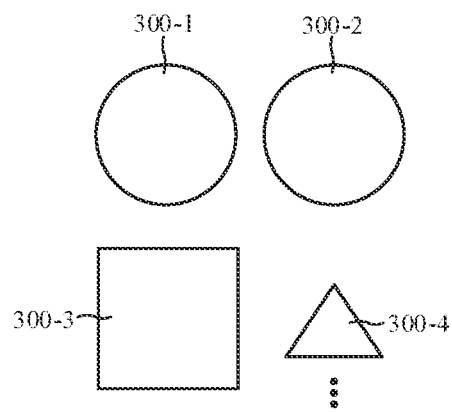
Figure 8E:
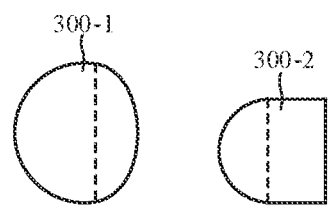
Figure 8F:
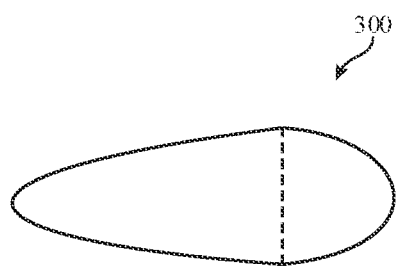

In general, the inactive hole(s) within the active area of the display may have any suitable shape and/or size, and there may be any desired number of holes of the same or different size/shape. FIG. 8B is a diagram showing three or more circular holes 300-1, 300-2, and 300-3 of different sizes that may be formed in the active area of the display. FIG. 8C is a diagram showing two or more rectangular holes 300-1 and 300-2 (e.g., share-shaped holes) of different sizes that may be formed in the active area of the display. FIG. 8D is a diagram showing how the display may be provided with at least two circular holes 300-1 and 300-2 of the same size and shape, a least a square hole 300-3, and/or a smaller triangular hole 300-4. FIG. 8E shows how the display may include at least a larger hole 300-1 with asymmetric arcs and a smaller hole 300-2 with a circular border on one side and a rectangular border on the other. FIG. 8F shows yet another suitable embodiment where hole 300 has asymmetrically tapered borders (e.g., the left portion of hole 300 has a more elongated tapered curving border, whereas the right portion of hole 300 has a relatively shorter tapered curving border). Each hole 300 may one or more curved edges (e.g., a convex border or a concave border) and/or one or more straight edges.

Figure 9A:
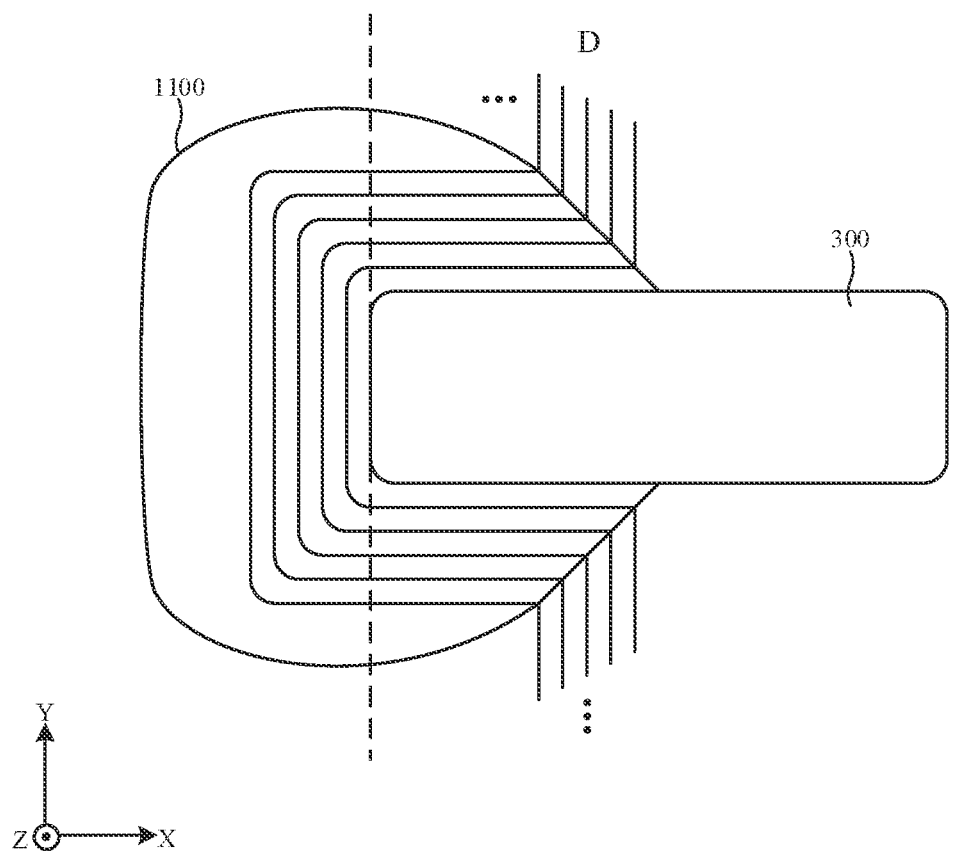
FIG. 9A is a top plan view illustrating a minimum hole border envelope associated with data lines that are routed around a hole in accordance with an embodiment.

The minimum required border width at the edge of hole 300 may determine how close display pixels may be formed from the edge of the hole and can therefore constrain the size of the active area when the border width is overly large. FIG. 9A is a top plan view illustrating a minimum hole border envelope 1100 associated with data lines that are routed around hole 300. As shown in FIG. 9A, multiple data lines D extending in the Y direction towards hole 300 may need to be routed around hole 300 (e.g., the data lines extending from the top of hole 300 may have a first intermediate segment extending to the west along the top edge of hole 300, a second intermediate segment extending to the south along the left edge of hole 300, and a third intermediate segment extending to the east along the bottom edge of hole 300), assuming they cannot be routed directly through hole 300 like shown in FIG. 4B. Each successive data line may be routed further and further away from the edge of hole 300, which pushes out the closest point at which a display pixel may be formed along the vertical segment of each data line. The minimum hole border envelope 1100 may therefore delineate where the closest display pixel may be formed along data lines relative to the edge of hole 300 (i.e., display pixels cannot be formed inside envelope 1100 and should only be formed outside of envelope 1100). A similar envelope may also exist for the right half of hole 300 assuming data lines are also routed around the right edge of hole 300.

Figure 9B:
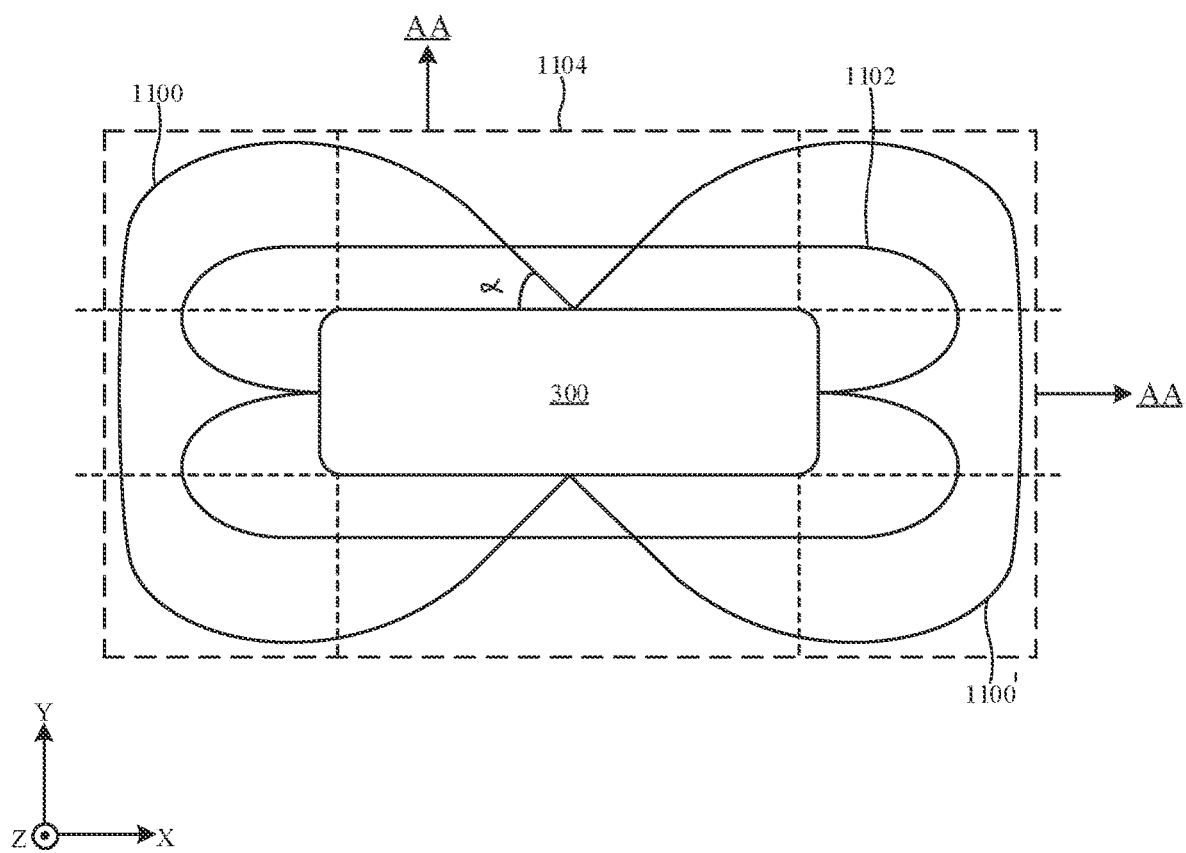
FIG. 9B is a top plan view illustrating how the display active area is constrained by the minimum hole border envelope shown in FIG. 11A in accordance with an embodiment.

FIG. 9B shows both the minimum border envelope 1100 for the left half of hole 300 and also the minimum border envelope 1100' for the right half of hole 300. Both envelopes

1100 and 1100' may be associated with the routing pattern of data lines routed substantially in the Y direction. As shown in FIGS. 2, 3, and 5-8 control lines such as gate lines, scan lines, emission lines, or other row control lines are also routed substantially in the X direction, and the control lines in rows overlapping with hole 300 may need to be routed around hole 300. Similar to the data lines shown in FIG. 9A, these row control lines that need to circumvent hole 300 may also have an associated minimum hole border envelope 1102 that delineates where the closest display pixel may be formed along the row control lines relative to the edge of hole 300 (i.e., display pixels also cannot be formed inside envelope 1102 and should only be formed outside of envelope 1102).

In the example of FIG. 9B, the envelope associated with the column-extending data lines (i.e., envelopes 1100 and 1100') may have an overall footprint that is larger than the envelope associated with the row-extending gate lines (i.e., envelope 1102). Thus, the edge of the active area (AA) as delineated by dotted line 1104 may be constrained by the size of envelope 1100 and 1100'. This may not always be the case. In other arrangements, the envelope associated with the row-extending gate lines may have an overall footprint that is larger than the envelope associated with the column-extending data lines (e.g., the footprint of envelope 1102 is larger than envelope 1100, 1100'). In such scenarios, the active area may be limited by the size of envelope 1100 and 1100'. The techniques described above in connection with FIGS. 3 and 5-8, which reduce the routing congestion at the border of hole 300, may be used to help minimize the size of envelope 1102 such that the active area size is no longer limited by the row line routing pattern, thereby increasing the size of the active area.

Figure 10A:
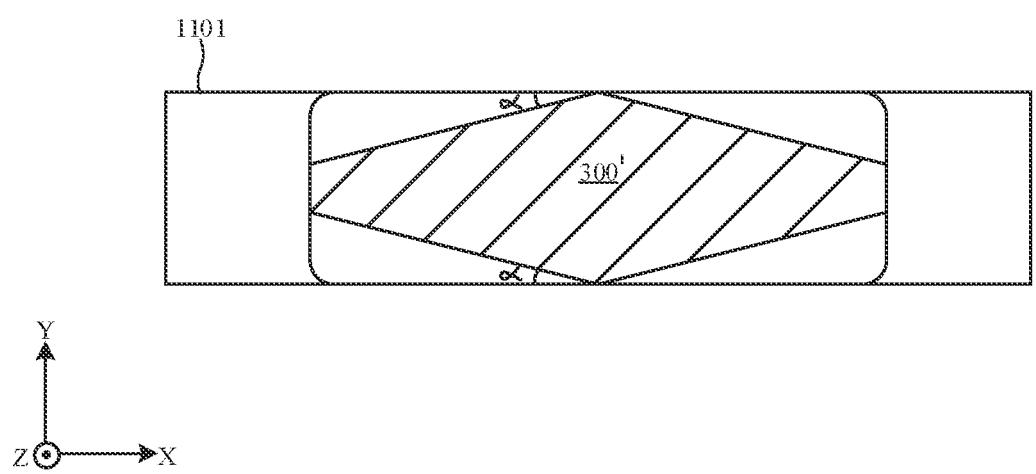
FIG. 10A is a diagram illustrating how reshaping a hole can reduce the size of the minimum hole border envelope in accordance with an embodiment.

FIG. 10A is a diagram illustrating how reshaping a hole can reduce the size of the minimum hole border envelope in accordance with an embodiment. As shown in FIG. 10A, a hole such as hole 300' (e.g., a through hole, an optical window, or other inactive display region) may have edges tapered inward by an angle α with respect to the X axis. This angle α by which the hole edge is narrowed may be equal to the angle α by which envelope 1100 extends outward from a rectangular hole 300 (see, e.g., FIG. 9B). Tapering hole 300' in this way may offset the increasing routing line congestion introduced by successive data lines that are being routed around hole 300' (e.g., the narrowed hole shape effectively makes space for data lines to be routed in an area that otherwise would have been occupied by a rectangular hole). Configured as such, the resulting minimum hole border envelope 1101 will have an overall footprint that is substantially smaller than that of the envelope 1100/1100' in FIG. 9B, which can further increase the size of the display active area.

Figure 10B:
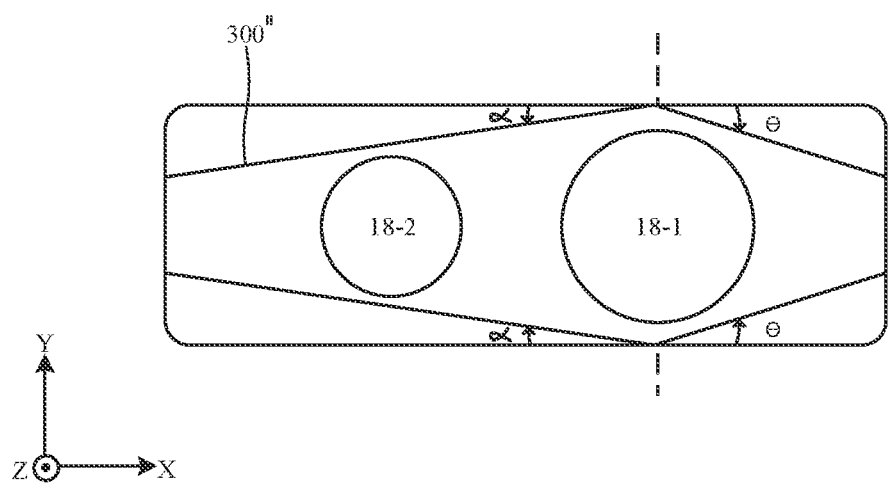
FIG. 10B is a diagram illustrating how a hole can be asymmetrically tapered in accordance with an embodiment.

The example of FIG. 10A in which hole 300' has a symmetrically tapered shape is merely illustrative and is not intended to limit the scope of the present embodiments. FIG. 10B illustrates another suitable arrangement in which a hole such as hole 300" (e.g., a through hole, an optical window, or other inactive display region) has an asymmetrically tapered shape. As shown in FIG. 10B, hole 300" may have a left portion tapered by angle α relative to the X axis and a right portion tapered by angle θ relative to the X axis. Such lopsided hole shape may, for example, be used to accommodate two or more electrical components from underneath the display (e.g., a first larger sensor 18-1 may be formed in a wider opening portion of hole 300", whereas a second smaller sensor 18-2 may be formed in a narrower opening portion of hole 300"). Thus, the unsymmetrical hole of FIG. 10B may simultaneously allow signals to pass through to multiple sub-display components while minimizing the minimum hole border envelope associated with vertical routing lines extending in the Y direction, which results in an overall reduced border width around hole 300" and a larger overall active area for the display. In general, a hole or inactive region within the active area of the display may have any suitable size or shape to accommodate any suitable number of sensor components (e.g., the shape of the hole or inactive region may also be optimized to reduce hole border width, thus maximize the display active area coverage).

Figure 11:
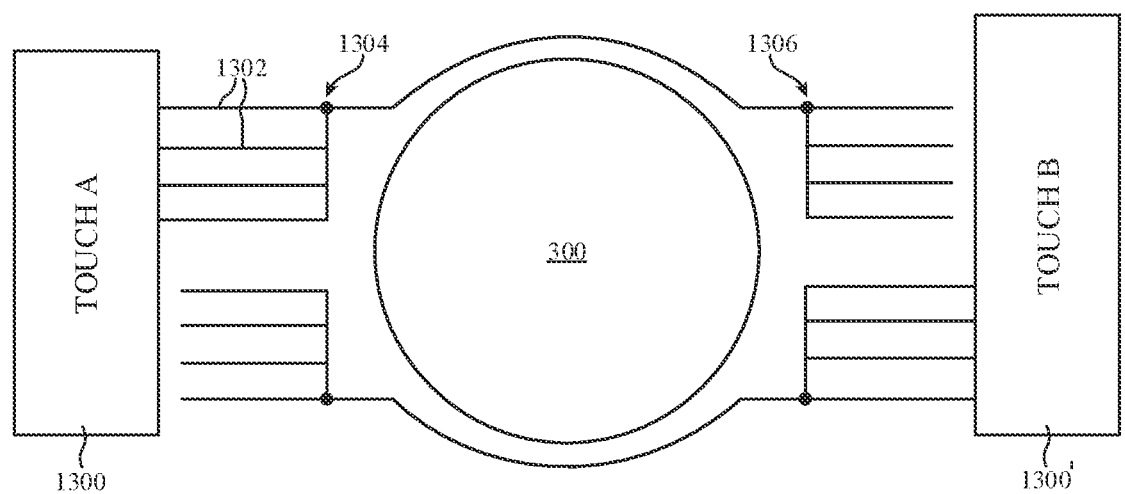
FIG. 11 is a top plan view of illustrative touch sensing circuitry showing how multi-row single-sided touch sensing circuits may be coupled to corresponding sensing lines that are shorted together prior to being routed around a hole in the active area in accordance with an embodiment.

If desired, the techniques described in connection with FIGS. 2-10 relating to reducing routing congestion for display control lines that are routed around a hole or inactive region may also be extending to touch sensor circuitry (see, e.g., FIG. 11). FIG. 11 is a top plan (layout) view showing how multi-row touch sensing circuits 1300 formed on the left edge of the electronic device and 1300' formed on the right edge of the electronic device may be coupled to corresponding sensing lines that are shorted together prior to being routed around hole 300 (e.g., a through hole, an optical window, or other non-display inactive region) in the active area. As shown in FIG. 11, multiple touch control lines 1302 may be merged at node 1304 prior to being routed around the border of hole 300. The merged routing line segment, which is a single intermediate routing wire connecting node 1304 to node 1306, may split at fanout node 1306 into multiple parallel lines for the active area to the right of hole 300. If desired, the methods and circuitry described herein may be extended to any type of signal or power line that has to be routed around or across a hole with the goal of minimizing routing congestion in the vicinity of the hole.

Figure 12A:
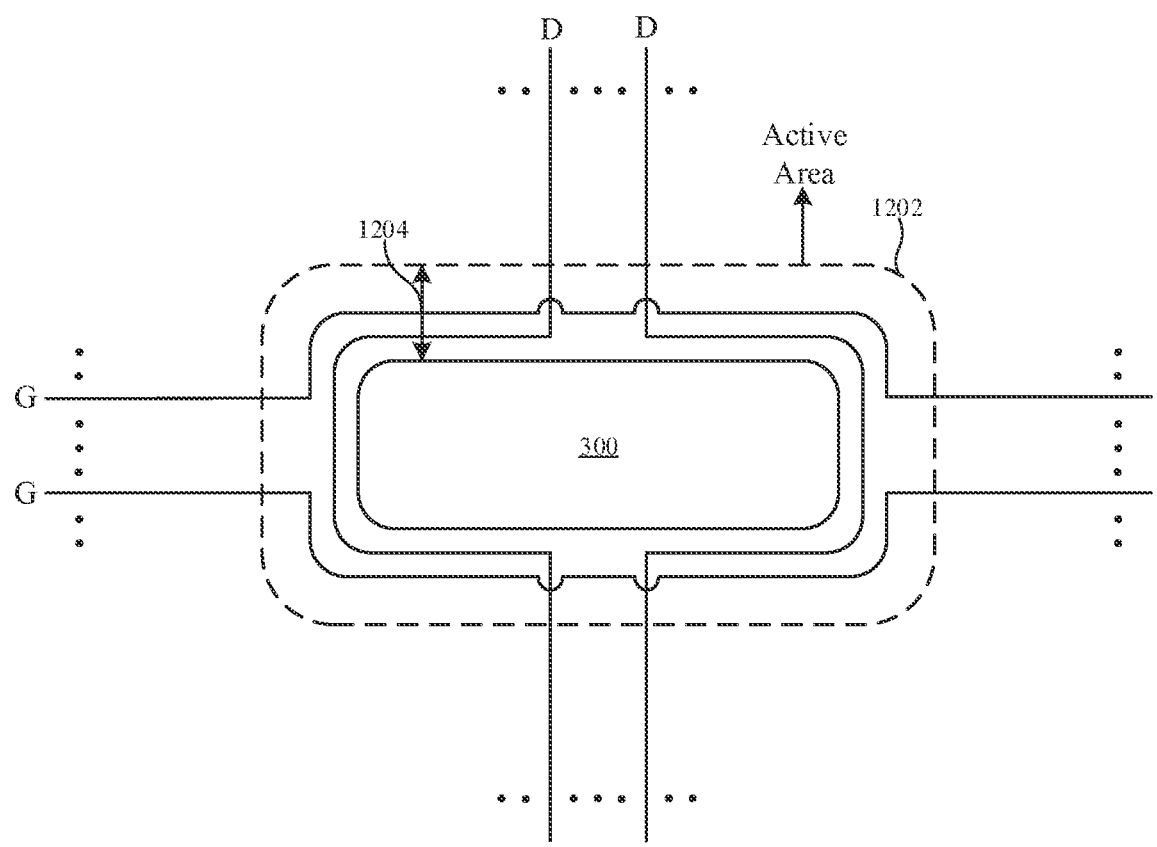
FIG. 12A is a top plan view showing row lines and column lines routed in a hole border region outside the active area in accordance with an embodiment.

FIG. 12A is a top plan (layout) view showing row lines and column lines routed in a hole border region outside the active area. As shown in FIG. 12A, the row lines (e.g., gate lines G, scan lines, emission lines, initialization lines, reset lines, reference lines, and/or other row-extending control lines) and the column lines (e.g., data lines D, positive power supply lines, ground power supply lines, and/or other column-extending control lines) in the vicinity of hole 300 may both be routed in the hole border region surrounding hole 300. The hole border region may be defined on one side by the edge of hole 300 and on the other side by the edge of active area (as demarcated by dotted line 1202). Defined in this way, the hole border region and the active area are non-overlapping regions. The hole border region surrounding hole 300 may therefore exhibit a hole border width 1204. As described above in connection with FIG. 9B, the techniques for reduce the routing congestion at the border of hole 300 may be used to help minimize the hole border region (i.e., to reduce the hole border width), thereby increasing the size of the active area.

Figure 12B:
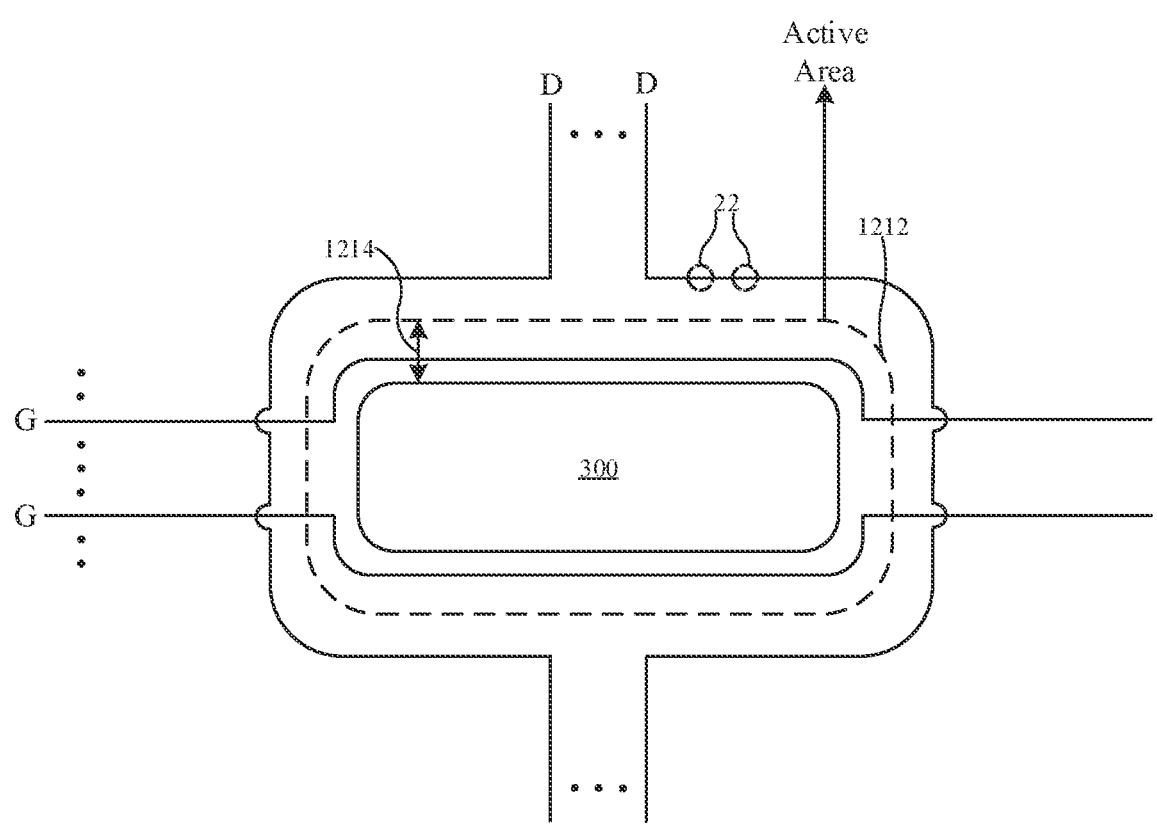
FIG. 12B is a top plan view showing row lines routed in a hole border region and column lines routed inside the active area in accordance with an embodiment.

To further maximize the size of the active area, FIG. 12B illustrates another suitable arrangement in which only the row lines are routed in the hole border region while the column lines are routed outside the hole border region and inside the active area (see, e.g., data lines D routed inside the active area edge 1212 and do not extend into the hole border region). Routing only the row control lines in the hole border region can further reduce the hole border width 1214. If desired, the row lines routed around the periphery of hole 300 may also be merged to help further reduce the hole border width. To enable formation of the column lines inside the active area, the column lines may be formed in an upper metal routing layer above the pixel transistors or in a buried metal layer below the pixel transistors (see description below in connection with FIGS. 13-16). Formed in this way inside the active area, the column lines may be routed directly over or directly under one or more pixels 22 in the active area. On the other hand, portions of the column lines that extend into the hole border region will not overlap with any pixels since there are no pixels formed within the holder border region.

Figure 12C:
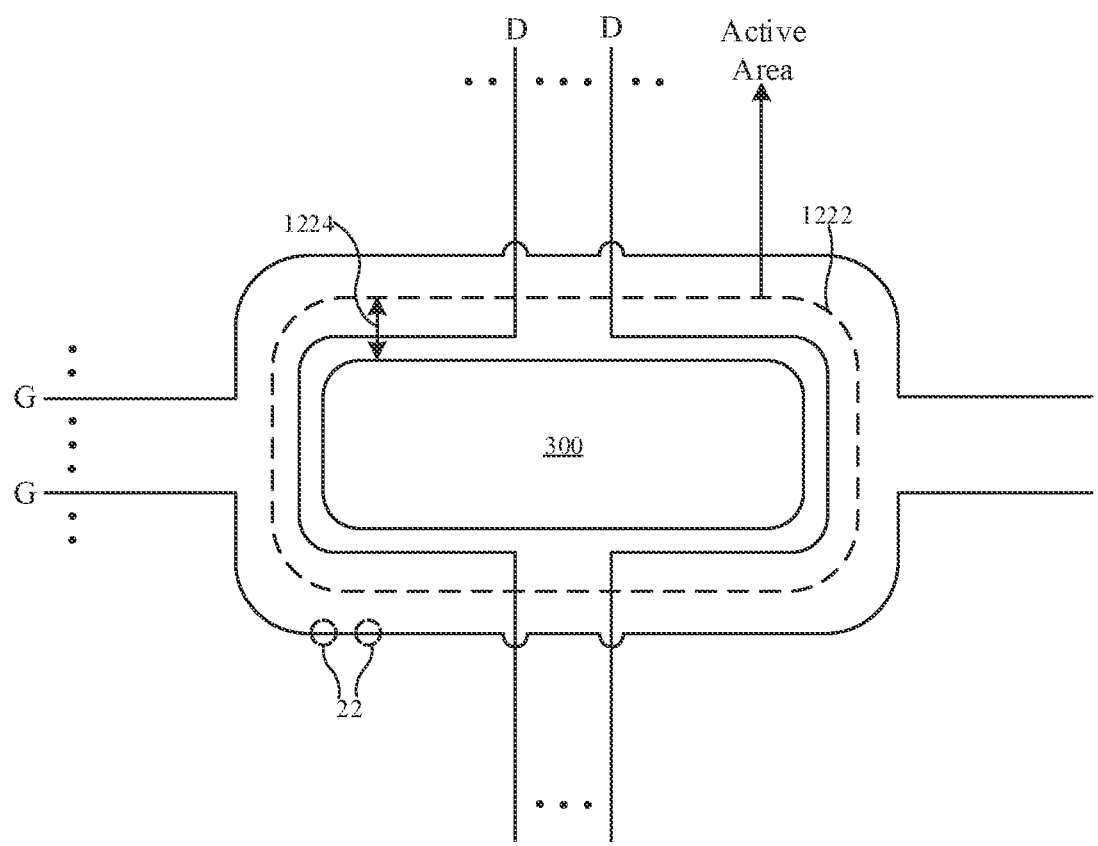
FIG. 12C is a top plan view showing column lines routed in a hole border region and row lines routed inside the active area in accordance with an embodiment.

FIG. 12C illustrates yet another suitable arrangement in which only the column lines are routed inside the hole border region while the row control lines are routed outside the hole border region and inside the active area (see, e.g., gate lines G routed inside the active area edge 1222 and do not extend into the hole border region). Routing only the column lines inside the hole border region can further reduce the hole border width 1224 and therefore maximize the size of the active area. To enable formation of the row control lines inside the active area, the row lines may be formed in an upper metal routing layer above the pixel transistors or in a buried metal layer below the pixel transistors (see description below in connection with FIGS. 13-16). Formed in this way inside the active area, the row lines may be routed directly over or directly under one or more pixels 22 in the active area.

Figure 13:
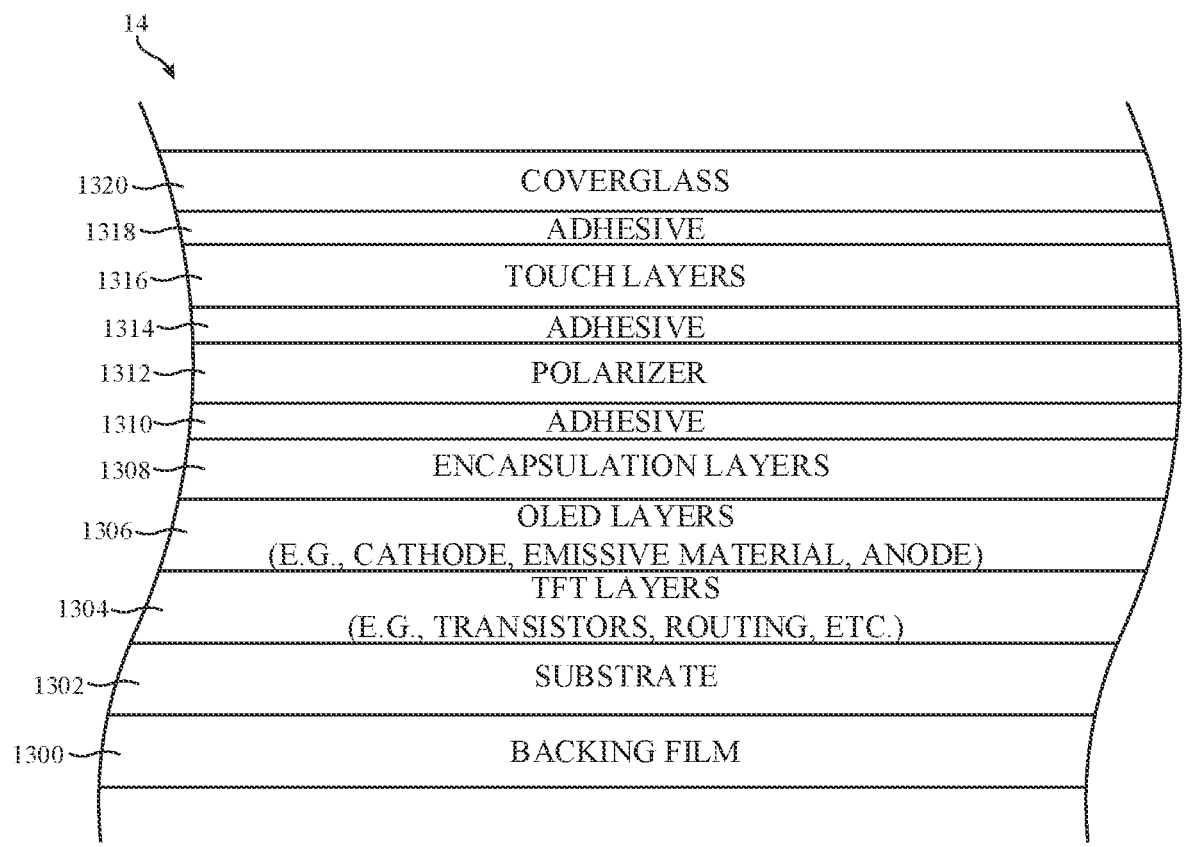
FIG. 13 is a cross-sectional side view of an illustrative display stackup in accordance with an embodiment.

FIG. 13 is a cross-sectional side view of an illustrative display stackup in accordance with an embodiment. As shown in FIG. 13, the display stack may include a backing film 1300 and a substrate layer such as substrate 1302 formed on backing film 1300. Substrate 1302 may be formed from glass, metal, plastic, ceramic, sapphire, or other suitable substrate materials. In some arrangements, substrate 1302 may be an organic substrate formed from polyimide (PI), polyethylene terephthalate (PET), or polyethylene naphthalate (PEN) (as examples). The surface of substrate 1302 may optionally be covered with one or more buffer layers (e.g., inorganic buffer layers such as layers of silicon oxide, silicon nitride, etc.).

Thin-film transistor (TFT) layers 1304 may be formed over substrate 1302. The TFT layers 1304 may include thin-film transistor circuitry such as thin-film transistors, thin-film capacitors, associated routing circuitry, and other thin-film structures formed within a plurality of alternating metal routing layers and dielectric layers. Organic light-emitting diode (OLED) layers 1306 may be formed over the TFT layers 1304. The OLED layers 1306 may include a cathode layer, an anode layer, and emissive material interposed between the cathode and anode layers.

Circuitry formed in the TFT layers 1304 and the OLED layers 1306 may be protected by encapsulation layers 1308. As an example, encapsulation layers 1308 may include a first inorganic encapsulation layer, an organic encapsulation layer formed on the first inorganic encapsulation layer, and a second inorganic encapsulation layer formed on the organic encapsulation layer. Encapsulation layers 1308 formed in this way can help prevent moisture and other potential contaminants from damaging the conductive circuitry that is covered by layers 1308.

One or more polarizer films 1312 may be formed over the encapsulation layers 1308 using adhesive layer 1310. Adhesive 1310 may be implemented using optically clear adhesive (OCA) material that offer high light transmittance. One or more touch layers 1316 that implement the touch sensor functions of touch-screen display 14 may be formed over polarizer films 1312 using adhesive 1314 (e.g., OCA material). For example, touch layers 1316 may include horizontal touch sensor electrodes and vertical touch sensor electrodes collectively forming an array of capacitive touch sensor electrodes. Lastly, the display stack may be topped off with a coverglass (CG) layer 1320 that is formed over the touch layers 1316 using additional adhesive 1318 (e.g., OCA material). Cover glass 1320 may serve as an outer protective layer for display 14.

Figure 14:
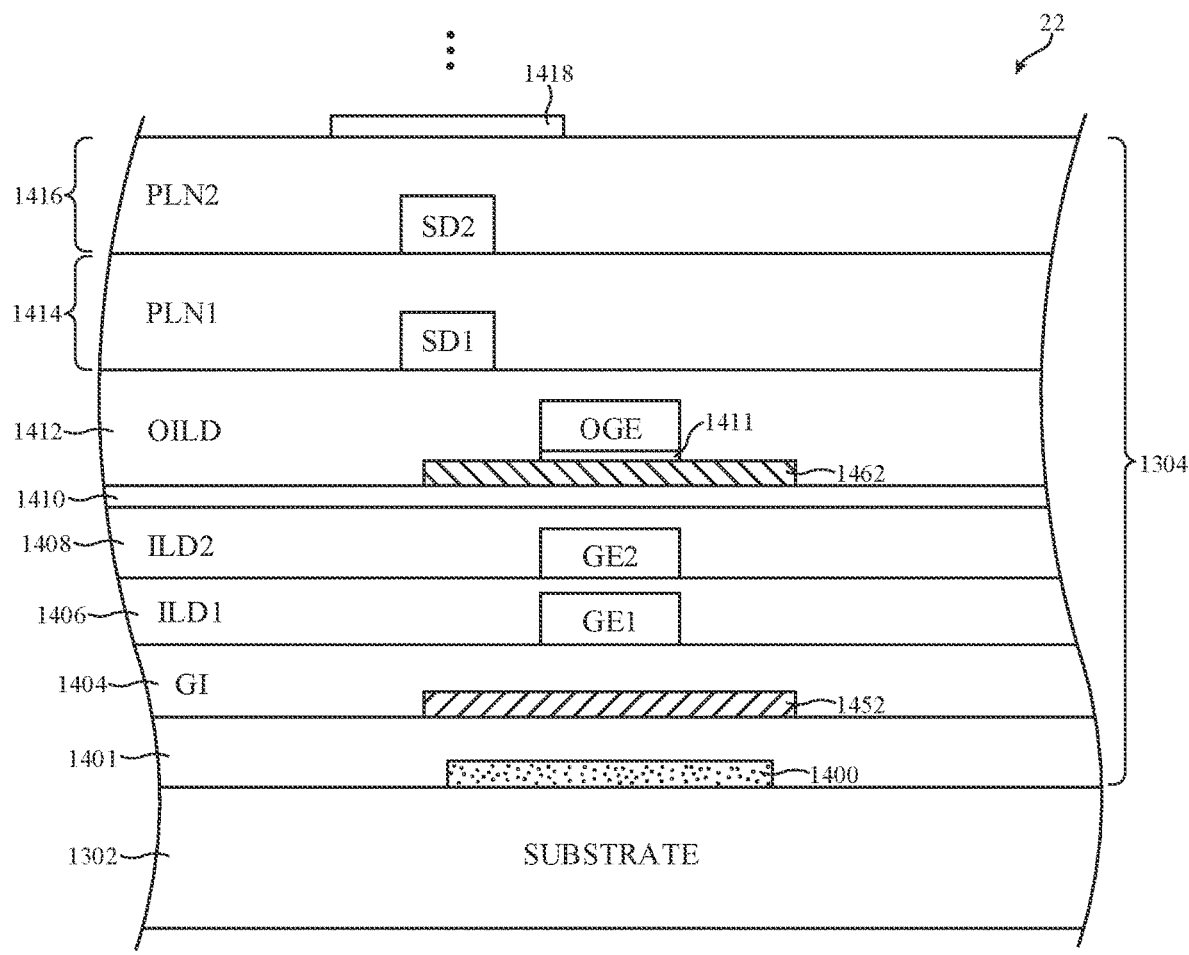
FIG. 14 is a cross-sectional side view of illustrative thin film transistor (TFT) layers in accordance with an embodiment.
Figure 15:
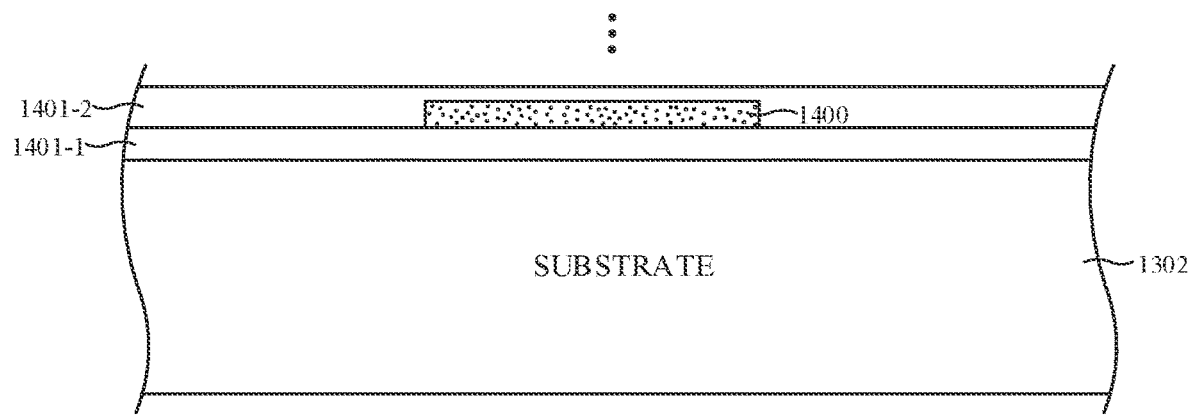
FIG. 15 is a cross-sectional side view of showing one suitable arrangement of a buried metal layer in accordance with an embodiment.
Figure 16:
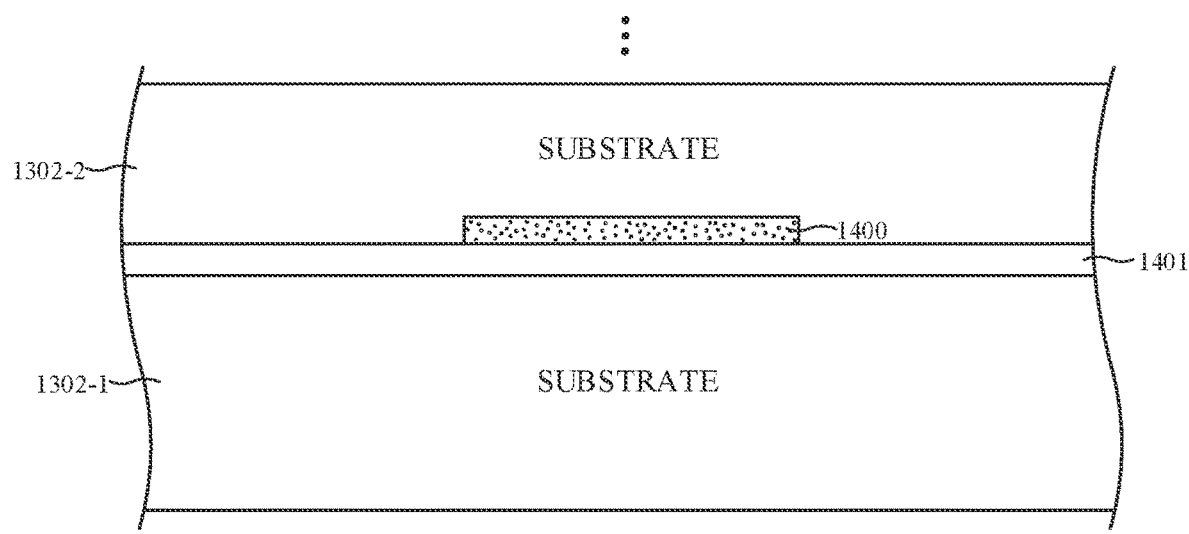
FIG. 16 is a cross-sectional side view of showing another suitable arrangement of a buried metal layer in accordance with an embodiment.

FIG. 14 is a cross-sectional side view of illustrative TFT layers 1304 of a display pixel 22 in accordance with an embodiment. As shown in FIG. 14, the TFT layers 1304 may include a buried conductive layer such as buried metal layer 1400 formed on substrate 1302. The buried metal layer 1400 and substrate 302 may optionally be covered with one or more buffer layers 1401 (e.g., inorganic buffer layers such as layers of silicon oxide, silicon nitride, etc.).

A polysilicon layer (e.g., a low temperature polysilicon or "LTPS" layer) may be formed on inorganic buffer layer 1401, patterned, and etched to form an LTPS region 1452. The two opposing ends of an LTPS region 1452 may optionally be doped (e.g., n-doped or p-doped) to form source-drain regions of a silicon transistor (e.g., an LTPS transistor) within a display pixel. In general, a display pixel may include any suitable number of silicon transistors (if any).

A gate insulator layer 1404 may be formed on buffer layer 1401 and over silicon region 1452. A first metal layer (e.g., a first gate metal layer "GE1") may be formed over the gate insulator layer 1404. The GE1 metal layer may be patterned and etched to form a gate conductor for the silicon transistor. If desired, the first metal layer may also be patterned and etched to form a terminal of one or more capacitor inside a display pixel.

A first interlayer dielectric (ILD1) layer 1406 may be formed over the first gate metal layer GE1 and the silicon transistor. Dielectric layer 1406 may (for example) be formed from silicon nitride, silicon oxide, and other suitable insulating material. A second metal layer (e.g., a second gate metal layer "GE2") may be formed on ILD1 layer 1406. The second metal layer may optionally be patterned and etched to form another terminal of one or more capacitor within a display pixel.

A second interlayer dielectric (ILD2) layer 1408 may be formed over the second gate metal layer GE2. Dielectric layer 1408 may be formed from silicon nitride, silicon oxide, and other suitable insulating material. One or more buffer layers such as buffer layer 1410 (e.g., an inorganic buffer layer such silicon oxide layer, silicon nitride layer, etc.) may be formed over dielectric layer 1408.

A semiconducting-oxide layer (e.g., an indium gallium zinc oxide or "IGZO" layer) may be formed over buffer layer 1410, which is sometimes referred to as an oxide buffer layer. The semiconducting-oxide layer may be patterned and etched to form semiconducting-oxide region 1462. The two opposing ends of a semiconducting-oxide region 1462 may optionally be doped (e.g., n-doped or p-doped) to form source-drain regions of a semiconducting-oxide transistor within a display pixel. In general, display pixel 22 may include any suitable number of semiconducting-oxide transistors (if any).

An insulation layer such as gate insulator layer 1411 may be formed on IGZO region 1462. An oxide (third) gate metal layer "OGE" may be formed on gate insulator layer 1411 to serve as the gate conductor for a semiconducting-oxide transistor. Another interlayer dielectric (OILD) layer 1412 may be formed on buffer layer 1410 and over the semiconducting-oxide transistor. Pixel 22 need not include any semiconducting-oxide transistors. In arrangements where pixel 22 does not include any semiconducting-oxide transistor, one or more of layers such as the oxide buffer layer 1410, semiconducting-oxide region 1462, gate liner 1411, the OGE layer, and/or the oxide ILD layer 2512 may not be formed when manufacturing pixel 22. Layers GE2 and dielectric layer 1408 are also optional if not needed to form capacitor structures.

A first interconnect layer above the silicon transistor and above the semiconducting-oxide transistor may be formed on dielectric layer 1412. Conductive routing structures formed in the first interconnect layer may be coupled down to the source-drain regions of each underlying transistor in pixel 22 and may therefore sometimes be referred to as the first source-drain metal layer "SD1."

A first planarization (PLN1) layer such as layer 1414 may be formed over the SD1 metal routing layer. A second interconnect layer may further be formed on the first planarization layer 1414. Conductive routing structures formed in the second interconnect layer may be coupled down to the SD1 conductors and may therefore sometimes be referred to as the second source-drain metal layer "SD2."

A second planarization (PLN2) layer such as layer 1416 may be formed on planarization layer 1414 and over the SD2 routing metal lines. Planarization layer 1414 and 1416 may be formed from organic dielectric materials such as a polymer. In contrast, the layers below the organic planarization layers such as layers 1404, 1406, 1408, 1410, and 1412 are typically formed from inorganic dielectric material such as silicon nitride, silicon oxide, etc. Anode 1418 (e.g., the anode terminal of an organic light-emitting diode within pixel 22) may be formed over second planarization layer 1416. Additional structures may be formed over anode 1418. For example, a pixel definition layer, light-emitting diode emissive material, cathode, and other pixel structures may also be included in the stackup of display pixel 22. However, these additional structures are omitted for the sake of brevity.

As described above in connection with FIGS. 12B and 12C, the row lines and column lines may optionally be routed within the active area using "upper" conductive layers (i.e., metal layers formed above the silicon transistors and the semiconducting-oxide transistors). As an example, the data lines D routed inside the active area as shown in FIG. 12B may be formed using the anode layer 1418. As another example, the row/column lines routed inside the active area may be formed using the SD1 or SD2 metal layer. As yet another example, the row/column lines routed inside the active area may be formed using one or more of touch sensor layers 1316 (see FIG. 13). These upper metal layers may be formed using aluminum, copper, silver, gold, or other suitable material with high conductivity.

As described above in connection with FIGS. 12B and 12C, the row lines and column lines may optionally be routed within the active area using a "buried" conductive layer (i.e., one or more metal layers formed below the pixel silicon transistors). As an example, the gate lines G routed inside the active area as shown in FIG. 12C may be formed using the buried metal layer 1400 formed directly on substrate 1302 as shown in FIG. 14. As another example, the row/column lines routed within the active area may be formed using a buried metal layer sandwiched between two inorganic buffer layers (see, e.g., FIG. 15 where buried metal layer 1400 is formed between buffer layers 1401-1 and 1401-2). As yet another example, the row/column lines routed within the active area may be formed using a buried metal layer that is embedded or buried within the substrate (see, e.g., FIG. 16 where buried metal layer 1400 is formed on inorganic buffer layer 1401 and buried between a first substrate layer 1302-1 and a second substrate layer 1302-2).

The foregoing is merely illustrative and various modifications can be made to the described embodiments. The foregoing embodiments may be implemented individually or in any combination.

What is claimed is:

1. Display circuitry, comprising:
   a first row of display pixels formed in an active area;
   a second row of display pixels formed in the active area;
   an inactive region within the active area;
   a display driver circuit configured to output a control signal onto a first row control line coupled to the first row of display pixels and to output the control signal onto a second row control line coupled to the second row of display pixels, wherein the first and second row control lines are merged into a segment that is routed by the inactive region across a first side of the inactive region; and
   an additional display driver circuit configured to output an additional control signal onto a third row control line coupled to the first row of display pixels and to output the additional control signal onto a fourth row control line coupled to the second row of display pixels, wherein the third and fourth row control lines are merged into an additional segment that is routed by the inactive region across a second side of the inactive region that is opposite the first side.

2. The display circuitry of claim 1, wherein the inactive region comprises a hole.

3. The display circuitry of claim 2, wherein the inactive region comprises a through hole.

4. The display circuitry of claim 2, wherein the inactive region comprises an optical window.

5. The display circuitry of claim 2, wherein the merged segment is routed around a border of the hole.

6. The display circuitry of claim 2, wherein the merged segment is routed directly across the hole.

7. The display circuitry of claim 1, wherein the display driver circuit is further configured to simultaneously output the control signal onto the first and second row control lines.

8. The display circuitry of claim 1, further comprising:
   a dummy circuit that is coupled to the merged segment and that is configured to increase a parasitic loading for the first and second row control lines.

9. The display circuitry of claim 1, wherein the merged segment is coupled between a first node and a second node, wherein the first node is connected to the first and second row control lines, and wherein the merged segment splits into at least first and second additional row control lines at the second node.

10. The display circuitry of claim 1, wherein the display driver circuit and the additional display driver circuit are disposed on opposite sides of the active area.

11. The display circuitry of claim 10, wherein the inactive region is physically interposed between the display driver circuit and the additional display driver circuit.

12. The display circuitry of claim 1, further comprising:
   a third row of display pixels formed in the active area, wherein the display driver circuit is further configured to output the control signal onto an additional row control line coupled to the third row of display pixels, and wherein the merged segment is also connected to the additional row control line.

13. The display circuitry of claim 1, wherein the inactive region has a tapered shape that is optimized to increase a size of the active area around the inactive region.

14. The display circuitry of claim 1, wherein the inactive region is asymmetric.

15. A display, comprising:
- display pixels formed in an active area;
- an inactive region at least partially surrounded by the active area;
- an additional inactive region separate from the inactive region and at least partially surrounded by the active area;
- a first routing segment coupled to a first group of the display pixels formed in a first portion of the active area on a first side of the inactive region;
- a second routing segment coupled to a second group of the display pixels formed in the first portion of the active area on the first side of the inactive region, wherein the first and second routing segments are connected at a node via a shorting segment;
- a merged segment that is connected to the node and that is routed by the inactive region and the additional inactive region, wherein the merged segment is configured to carry a first control signal for the first and second groups of the display pixels;
- an additional merged segment coupled to multiple routing segments for the first and second groups of the display pixels and configured to carry a second control signal for the first and second groups of the display pixels; and
- dummy loading circuitry coupled to the merged segment, wherein the additional inactive region has first and second opposing sides separated from each other by a dimension of the additional inactive region that is smaller than a corresponding dimension of the inactive region, wherein the dummy loading circuitry is disposed along the first side of the additional inactive region, and wherein the additional merged segment runs along the second side of the additional inactive region.

16. The display of claim 15, further comprising:
- a third routing segment coupled to a third group of the display pixels formed in a second portion of the active area on a second side of the inactive region; and
- a fourth routing segment coupled to a fourth group of the display pixels formed in the second portion of the active area on the second side of the inactive region, wherein the third and fourth routing segments are connected to the merged segment at a fanout node.

17. The display of claim 16, wherein the first routing segment and the third routing segment are coupled to a same row of the display pixels.

18. The display of claim 15, wherein the first routing segment is parallel to the second routing segment.

19. The display of claim 15, wherein the first group of the display pixels and the second group of the display pixels correspond to adjacent rows of the display pixels in the active area.

20. The display of claim 15, wherein the first group of the display pixels and the second group of the display pixels correspond to non-adjacent rows of the display pixels in the active area.

21. A display, comprising:
- an array of pixels formed within an active area;
- an inactive region at least partially surrounded by the active area, wherein the inactive region has a border region and wherein the border region is non-overlapping with the active area;
- first routing lines that extend in a first direction across the display, wherein at least some of the first routing lines are merged to form one or more merged segments that extend into the border region of the inactive region; and
- second routing lines that extend in a second direction across the display and that have portions that are routed by the border region of the inactive region, wherein the portions of the second routing lines overlap pixel transistors of one or more pixels in the array of pixels within the active area and wherein each routing line in the second routing lines is coupled to pixels in the array of pixels on opposing sides of the inactive region.

22. The display of claim 21, wherein the second direction is perpendicular to the first direction.

23. The display of claim 21, wherein the first routing lines comprise gate lines, and wherein the second routing lines comprise data lines.

24. The display of claim 21, wherein the first routing lines comprise data lines, and wherein the second routing lines comprise gate lines.

25. The display of claim 21, wherein the second routing lines are formed using an anode layer.

26. The display of claim 21, wherein the second routing lines are formed using a source-drain metal routing layer.

27. The display of claim 21, wherein the second routing lines are formed using touch sensor layers.

28. The display of claim 21, wherein the second routing lines are formed using a buried metal layer that is formed over a substrate layer and under a low temperature polysilicon layer.

29. The display of claim 21, wherein the second routing lines do not overlap the first routing lines within the border region.

* * * * *